(12) United States Patent
Jung et al.

(10) Patent No.: US 8,547,461 B2
(45) Date of Patent: Oct. 1, 2013

(54) ANALOG-TO-DIGITAL CONVERTER HAVING A COMPARISON SIGNAL GENERATION UNIT AND IMAGE SENSOR INCLUDING THE SAME

(75) Inventors: Wun-Ki Jung, Suwon-si (KR); Seung-Hyun Lim, Yongin-si (KR); Dong-Hun Lee, Yongin-si (KR); Kwi-Sung Yoo, Seoul (KR); Min-Ho Kwon, Seoul (KR); Chi-Ho Hwang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 41 days.

(21) Appl. No.: 13/240,670

(22) Filed: Sep. 22, 2011

(65) Prior Publication Data
US 2012/0098990 A1    Apr. 26, 2012

(30) Foreign Application Priority Data

Oct. 22, 2010    (KR) .................. 10-2010-0103205

(51) Int. Cl.
*H04N 3/14*   (2006.01)
*H03M 1/12*   (2006.01)

(52) U.S. Cl.
USPC ......................................... 348/294; 341/155

(58) Field of Classification Search
USPC ................................. 348/294; 341/155–172
See application file for complete search history.

(56) References Cited

U.S. PATENT DOCUMENTS

| 8,040,269 B2 * | 10/2011 | Bogaerts ..................... 341/169 |
| 2010/0039306 A1 | 2/2010 | Simony et al. |
| 2010/0265374 A1 * | 10/2010 | Nishi .......................... 348/302 |
| 2012/0039548 A1 * | 2/2012 | Wang et al. .................. 382/312 |

FOREIGN PATENT DOCUMENTS

| JP | 2009-218964 A | 9/2009 |
| KR | 10 2008-0046484 A | 5/2008 |

* cited by examiner

*Primary Examiner* — Roberto Velez
*Assistant Examiner* — Padma Haliyur
(74) *Attorney, Agent, or Firm* — Lee & Morse, P.C.

(57) ABSTRACT

An analog-to-digital converter includes a comparison signal generation unit and a control unit. The comparison signal generation unit determines a logic level of a comparison signal by comparing an input signal with a selected reference signal based on a switch control signal in a first comparison mode, and by comparing a difference voltage with a ramp signal based on the switch control signal in a second comparison mode. The difference voltage is generated based on the input signal and the selected reference signal such that a level of the difference voltage is lower than a fine voltage level corresponding to a voltage level of the selected reference signal in the second comparison mode. The control unit generates the switch control signal based on the comparison signal and a mode selection signal.

15 Claims, 18 Drawing Sheets

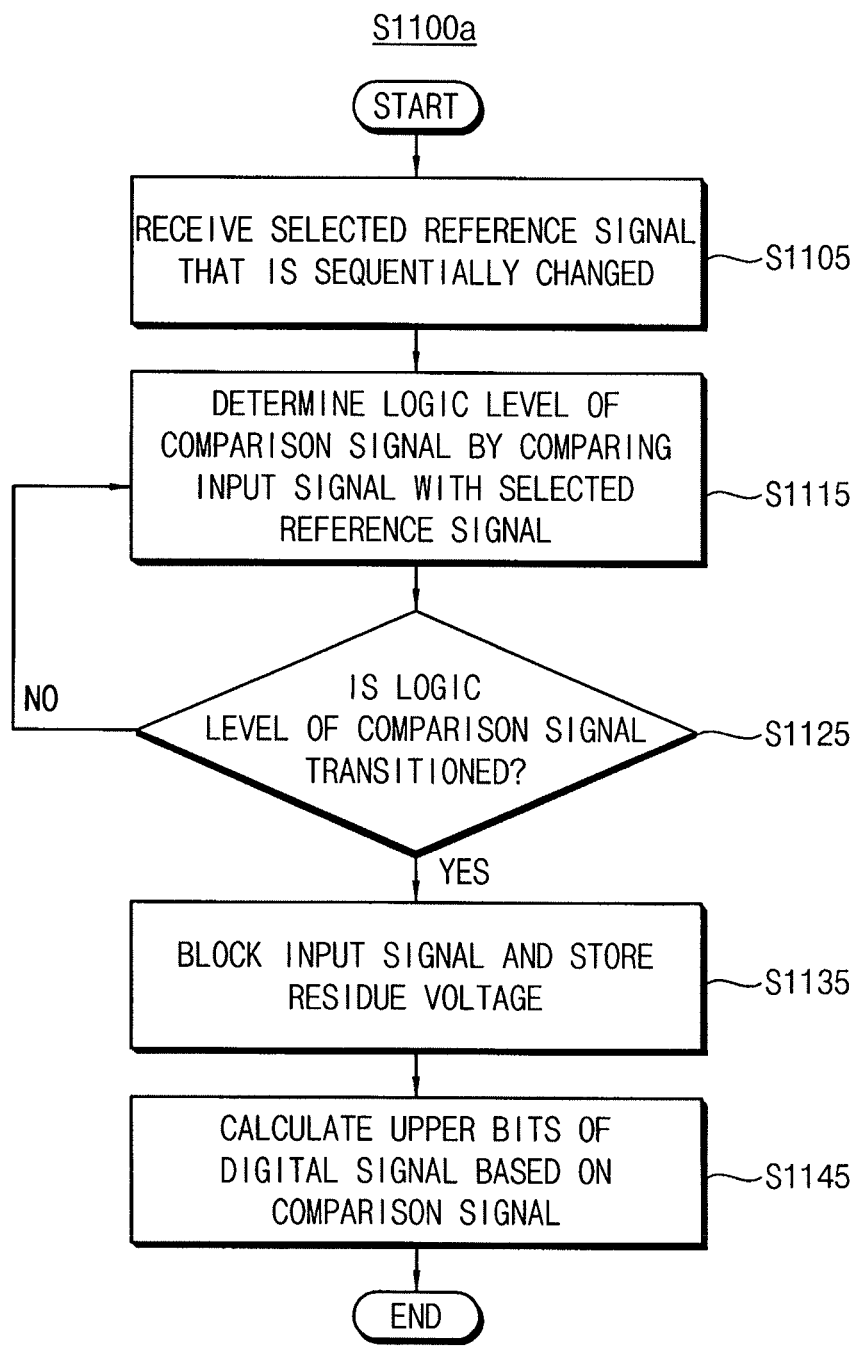

ANALOG-TO-DIGITAL CONVERTER HAVING A COMPARISON SIGNAL GENERATION UNIT AND IMAGE SENSOR INCLUDING THE SAME

CROSS-REFERENCE TO RELATED APPLICATION

Korean Patent Application No. 10-2010-0103205, filed on Oct. 22, 2010, in the Korean Intellectual Property Office, and entitled: "Analog-to-Digital Converter and Image Sensor Including the Same," is incorporated by reference herein in its entirety.

BACKGROUND

1. Field

Example embodiments relate to a signal converter, and more particularly to an analog-to-digital converter and an image sensor including the analog-to-digital converter.

2. Description of the Related Art

To capture images, image sensors of a charge coupled device (CCD) type or a complementary metal oxide semiconductor (CMOS) type are widely used. Typically, an image sensor includes an analog-to-digital converter that converts an analog signal (e.g., a pixel output voltage) output from a unit pixel into a digital signal. The analog-to-digital converter may operate in various schemes. For example, the analog-to-digital converter may convert the analog signal into the digital signal in a single-slope scheme by comparing the pixel output voltage with a ramp voltage, and by counting a clock signal until the ramp voltage is the same as the pixel output voltage.

SUMMARY

One or more embodiments provide an analog-to-digital converter capable of having enhanced operation speed and low power consumption.

One or more embodiments provide an image sensor having the analog-to-digital converter.

One or more embodiments provide an analog-to-digital converter configured to prevent offset mismatching and ramp voltage slope mismatching because the analog-to-digital converter uses one ramp signal, and to prevent time noises and unnecessary power consumption because the analog-to-digital converter includes the comparison signal generation unit without sampling capacitors.

One or more embodiments provides an analog-to-digital converter configured to perform a fine comparison operation based on a difference voltage that is converted from the input signal and has a level which is lower than the fine voltage level, which may reduce power consumption and signal conversion time.

One or more embodiments provide an analog-to-digital converter including a comparison signal generation unit and a control unit. The comparison signal generation unit determines a logic level of a comparison signal by comparing an input signal with a selected reference signal based on a switch control signal in a first comparison mode, and determines the logic level of the comparison signal by comparing a difference voltage with a ramp signal based on the switch control signal in a second comparison mode. The difference voltage is generated based on the input signal and the selected reference signal such that a level of the difference voltage is lower than a fine voltage level corresponding to a voltage level of the selected reference signal in the second comparison mode. The control unit generates the switch control signal based on the comparison signal and a mode selection signal.

The comparison signal generation unit may perform a first comparison operation on the input signal and the selected reference signal in the first comparison mode, and may store a residue voltage generated by performing the first comparison operation in the first comparison mode.

The residue voltage may correspond to a difference between a voltage level of the input signal and a voltage level of the selected reference signal at a point in time at which the comparison signal is transitioned from a first logic level to a second logic level in the first comparison mode.

The comparison signal generation unit may generate the difference voltage by subtracting the residue voltage from the selected reference signal in the second comparison mode, and may perform a second comparison operation on the difference voltage and the ramp signal in the second comparison mode.

A voltage level of the selected reference signal may be sequentially increased or decreased from an initial voltage level by a predetermined voltage level during the first comparison mode, and may be the fine voltage level during the second comparison mode. The level of the difference voltage may be between the initial voltage level and the fine voltage level.

The comparison signal generation unit may include an input unit and a comparison unit. The input unit may selectively output one of the input signal and the difference voltage as a first signal based on the switch control signal, and may selectively output one of the selected reference signal and the ramp signal as a second signal based on the switch control signal. The comparison unit may compare the first signal with the second signal to generate the comparison signal.

The switch control signal includes a first switch control signal and a second switch control signal. The input unit may include a first input block and a second input block. The first input block may provide the input signal to the comparison unit based on the first switch control signal in the first comparison mode. The second input block may store a residue voltage corresponding to the input signal and provide the selected reference signal to the comparison unit based on the second switch control signal in the first comparison mode. The second input block may generate the difference voltage by subtracting the residue voltage from the selected reference signal and provide the difference voltage and the ramp signal to the comparison unit based on the second switch control signal in the second comparison mode.

The switch control signal includes a first switch control signal and a second switch control signal. The input unit may include a first switch, a capacitor, a second switch and a third switch. The first switch may selectively connect an input terminal of the input signal to a first input terminal of the comparison unit in response to the first switch control signal. The capacitor may be connected between the first input terminal of the comparison unit and an input terminal of the selected reference signal. The second switch may selectively connect the input terminal of the selected reference signal to a second input terminal of the comparison unit in response to an inversion signal of the second switch control signal. The third switch may selectively connect the second input terminal of the comparison unit to an input terminal of the ramp signal in response to the second switch control signal.

The first switch and the second switch may be turned on during the first comparison mode and may be turned off during the second comparison mode. The third switch may be turned off during the first comparison mode and may be turned on during the second comparison mode.

The analog-to-digital converter may further include a reference signal selection unit. The reference signal selection unit may output the selected reference signal by selecting one of reference voltages based on a selection control signal. The control unit further may generate the selection control signal based on the comparison signal and the mode selection signal.

The reference voltages may include first through n-th reference voltages, where n is a natural number equal to or greater than two. The first through n-th reference voltages may be increased or decreased by a predetermined voltage level as n increases.

The reference signal selection unit may sequentially increase or decrease the voltage level of the selected reference signal from an initial voltage level to a final voltage level based on the selection control signal during a first period of the first comparison mode. The reference signal selection unit may maintain the voltage level of the selected reference signal as the final voltage level based on the selection control signal during a second period of the first comparison mode. The first comparison mode may be divided into the first period and the second period depending on the logic level of the comparison signal.

The selection control signal may include a plurality of control signals. The reference signal selection unit may include a plurality of switches such that each switch selectively provides one of the reference voltages to an output terminal of the reference signal selection unit based on a respective one of the plurality of control signals.

The analog-to-digital converter may further include a digital signal generation unit. The digital signal generation unit may generate a digital signal corresponding to the input signal by counting a clock signal based on the comparison signal.

One or more embodiments provide an image sensor includes a pixel array and an analog-to-digital converter. The pixel array includes a plurality of unit pixels, and each unit pixel converts an incident light into a pixel signal. The analog-to-digital converter generates a digital signal based on the pixel signal, a selected reference signal and a ramp signal. The analog-to-digital converter includes a comparison signal generation unit and a control unit. The comparison signal generation unit determines a logic level of a comparison signal by comparing the pixel signal with the selected reference signal based on a switch control signal in a first comparison mode, and determines the logic level of the comparison signal by comparing a difference voltage with the ramp signal based on the switch control signal in a second comparison mode. The difference voltage is generated based on the pixel signal and the selected reference signal such that a level of the difference voltage is lower than a fine voltage level corresponding to a voltage level of the selected reference signal in the second comparison mode. The comparison signal corresponds to the digital signal. The control unit generates the switch control signal based on the comparison signal and a mode selection signal.

One or more embodiments provide an analog-to-digital converter, including a comparison signal generator configured to determine a logic level of a comparison signal by performing a coarse comparison between an input signal and a selected reference signal during a first period in accordance with a control signal, and performing a fine comparison between a difference voltage and a ramp signal during a second period, wherein the first period precedes the second period, and the difference voltage is generated based on the input signal and the selected reference signal.

The reference signal and the ramp signal may be supplied to the comparison signal generator from a reference voltage generator.

The analog-to-digital converter may include a controller configured to generate the control signal based on the comparison signal and a mode selection signal corresponding to the coarse comparison and the fine comparison.

The selected reference signal may be sequentially updated during the coarse comparison and is fixed during the fine comparison.

The voltage of the selected reference signal may be maintained during the fine comparison corresponds to a fine voltage level, and the difference voltage may be lower than the fine voltage level.

BRIEF DESCRIPTION OF THE DRAWINGS

Features will become more apparent to those of ordinary skill in the art by describing in detail exemplary embodiments with reference to the attached drawings, in which:

FIG. 6A illustrates a flow chart of an exemplary embodiment of a first comparison operation employable in the method of FIG. 5;

DETAILED DESCRIPTION

Figure 1:
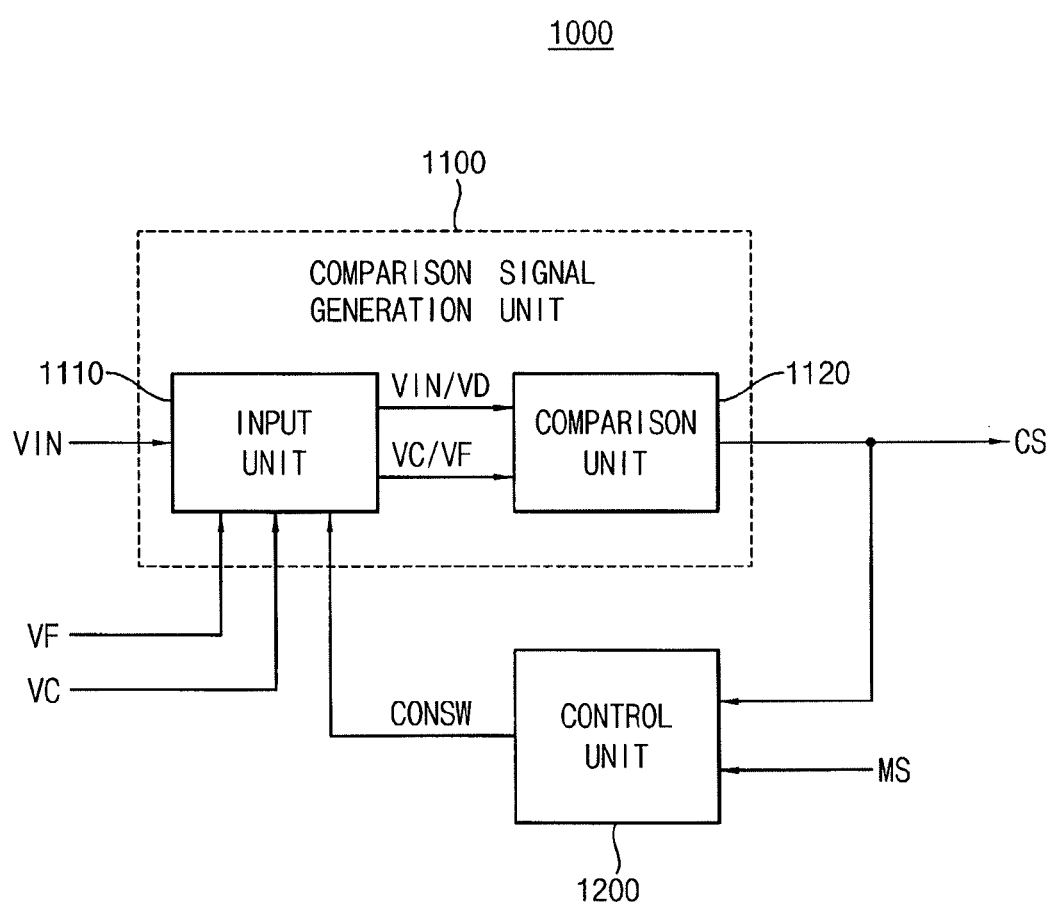
FIG. 1 illustrates a block diagram of an exemplary embodiment of an analog-to-digital converter.

Various example embodiments will be described more fully with reference to the accompanying drawings, in which embodiments are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates a block diagram of an exemplary embodiment of an analog-to-digital converter 1000.

Referring to FIG. 1, the analog-to-digital converter 1000 may include a comparison signal generation unit 1100 and a control unit 1200.

The analog-to-digital converter 1000 may operate alternatively in two modes, that is, a first comparison mode and a second comparison mode. The first comparison mode may be referred to as a coarse comparison mode and the second comparison mode may be referred to as a fine comparison mode. The analog-to-digital converter 1000 may convert an analog input signal into a digital signal with multiple comparisons, e.g., a two-step comparison. More particularly, e.g., the analog-to-digital converter 1000 may perform a first comparison operation (e.g., a coarse comparison operation) with respect to the analog input signal in the first comparison mode, and may perform a second comparison operation (e.g., a fine comparison operation) with respect to the analog input signal in the second comparison mode. In addition, the analog-to-digital converter 1000 may convert the analog input signal into the digital signal using a single-slope scheme.

Thus, in one or more embodiments, e.g., the analog-to-digital converter 1000 may operate using the single-slope scheme with the two-step comparison.

The comparison signal generation unit 1100 may generate a comparison signal CS based on an input signal VIN, a selected reference signal VC, a ramp signal VF, and a switch control signal CONSW. The comparison signal generation unit 1100 may determine a logic level of the comparison signal CS by comparing the input signal VIN with the selected reference signal VC based on the switch control signal CONSW in the first comparison mode. The comparison signal generation unit 1100 may determine the logic level of the comparison signal CS by comparing a difference voltage VD with the ramp signal VF based on the switch control signal CONSW in the second comparison mode. The difference voltage VD may be generated based on the input signal VIN and the selected reference signal VC. The level of the difference voltage VD may be lower than a fine voltage level, and the fine voltage level corresponds to a voltage level of the selected reference signal VC in the second comparison mode. For example, the difference voltage VD may be converted (e.g., level-down converted) from the input signal VIN. The level of the difference voltage VD may be between an initial voltage level of the selected reference signal VC and the fine voltage level.

The comparison signal generation unit 1100 may receive the selected reference signal VC and the ramp signal VF from a reference voltage generator (not illustrated). The reference voltage generator may be disposed in or out of the analog-to-digital converter 1000. In one or more embodiments, the reference voltage generator may be a ramp voltage generator.

The selected reference signal VC may be sequentially updated during the first comparison mode and may be fixed during the second comparison mode. In one or more embodiments, the voltage level of the selected reference signal VC may be increased or decreased in a step-wise manner during the first comparison mode. That is, the voltage level of the selected reference signal VC may be increased or decreased from the initial voltage level to a final voltage level by a predetermined voltage level per a predetermined time period during the first comparison mode. In another example embodiment, the voltage level of the selected reference signal VC may be increased or decreased from the initial voltage level to the final voltage level in a step-wise manner during a first period of the first comparison mode, and may be maintained as the final voltage level during a second period of the first comparison mode. The voltage level of the selected reference signal VC may be maintained as the fine voltage level during the second comparison mode.

The ramp signal VF may be increased or decreased between the initial voltage level and the fine voltage level with a predetermined slope during the second comparison mode. As described below with reference to FIGS. 13 through 16, the analog-to-digital converter 1000 may be employed in an image sensor that includes a pixel array in which unit pixels are arranged in a matrix form. The input signal VIN may be an analog pixel signal generated from each unit pixel.

In one or more embodiments, the comparison signal generation unit 1100 may include an input unit 1110 and a comparison unit 1120. The input unit 1110 may selectively output one of the input signal VIN and the difference voltage VD as a first signal based on the switch control signal CONSW, and may selectively output one of the selected reference signal VC and the ramp signal VF as a second signal based on the switch control signal CONSW. The input unit 1110 may store a residue voltage corresponding to the input signal VIN in the first comparison mode, and may generate the difference voltage VD in the second comparison mode. The residue voltage VS may correspond to a difference between a voltage level of the input signal VIN and a voltage level of the selected reference signal VC at a point in time at which the comparison signal CS is transitioned from a first logic level to a second logic level in the first comparison mode. In one or more embodiments, the input unit 1110 may include a capacitor for storing the residue voltage, but may not include sampling capacitors for providing the selected reference signal VC or the ramp signal VF to the comparison unit 1120.

The comparison unit 1120 may compare the first signal with the second signal to generate the comparison signal CS. For example, the comparison unit 1120 may compare the input signal VIN with the selected reference signal VC to determine the logic level of the comparison signal CS in the first comparison mode. The comparison unit 1120 may compare the difference voltage VD with the ramp signal VF to determine the logic level of the comparison signal CS in the second comparison mode.

The control unit 1200 may generate the switch control signal CONSW based on the comparison signal CS and a mode selection signal MS. The analog-to-digital converter 1000 may operate in the first comparison mode or in the second comparison mode depending on a logic level of the mode selection signal MS.

In one or more embodiments, the control unit 1200 may include at least one logic element that performs a logic operation on the comparison signal CS and the mode selection signal MS to generate the switch control signal CONSW. In one or more other embodiments, the control unit 1200 may further receive a clock signal (not illustrated), and the control unit 1200 may include at least one logic element that performs a logic operation on the comparison signal CS, the mode selection signal MS, and the clock signal to generate the switch control signal CONSW.

As described below with reference to FIG. 3, the analog-to-digital converter 1000 may further include a reference signal selection unit that outputs the selected reference signal VC by selecting one of a plurality of reference voltages. As described below with reference to FIG. 10, the analog-to-digital converter 1000 may further include a digital signal generation unit that generates a digital signal corresponding to the input signal VIN based on the comparison signal CS.

One or more embodiments of the analog-to-digital converter 1000 may prevent offset mismatching and ramp voltage slope mismatching because the analog-to-digital converter 1000 may use one ramp signal VF. One or more embodiments of the analog-to-digital converter 1000 may prevent time noises and unnecessary power consumption because the analog-to-digital converter 1000 may include the comparison signal generation unit 1100 without sampling capacitors. In addition, the analog-to-digital converter 1000 may perform the fine comparison operation based on the difference voltage VD that is converted (e.g., the level-down converted) from the input signal VIN and has the level, which is lower than the fine voltage level. One or more embodiments of the analog-to-digital converter 1000 may reduce power consumption and signal conversion time although a frame rate, a resolution, and the number of unit pixels in the image sensor are increased. The analog-to-digital converter 1000 may have enhanced operation speed and may be employed in an image sensor having a relatively high frame rate and high resolution.

Figure 2:
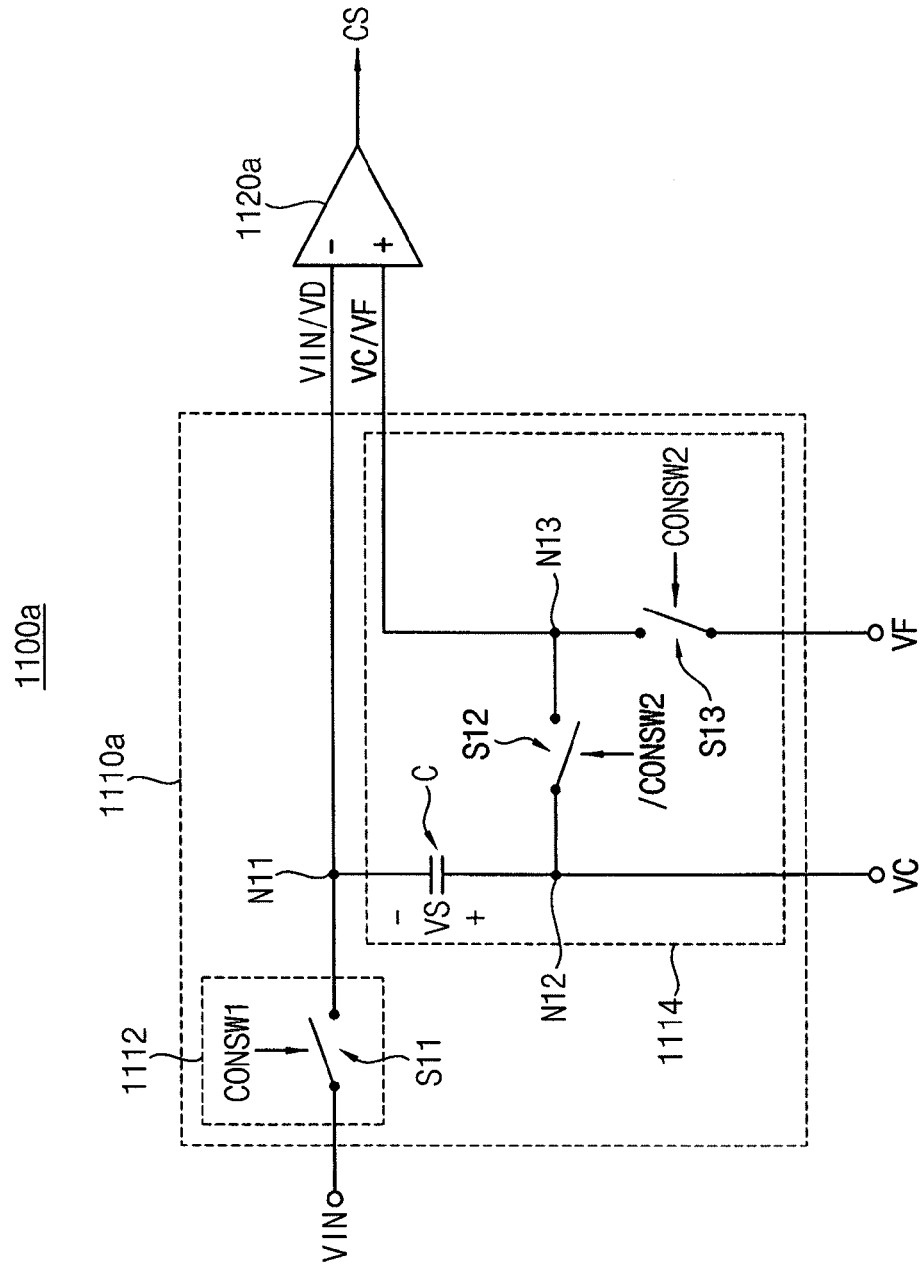
FIG. 2 illustrates a diagram of an exemplary embodiment of a comparison signal generation unit employable in the analog-to-digital converter of FIG. 1.

FIG. 2 illustrates a diagram of an exemplary embodiment of a comparison signal generation unit employable 1100a in the analog-to-digital converter 1000 of FIG. 1.

Referring to FIG. 2, the comparison signal generation unit 1100a may include an input unit 1110a and a comparison unit 1120a.

As described above with reference to FIG. 1, the input unit 1110a may operate based on the switch control signal CONSW. The input unit 1110a may store the residue voltage VS corresponding to the input signal VIN in the first comparison mode, and may generate the difference voltage VD in the second comparison mode. The input unit 1110a may selectively output one of the input signal VIN and the difference voltage VD, and may selectively output one of the selected reference signal VC and the ramp signal VF depending on the comparison mode.

The residue voltage VS may correspond to a difference between a voltage level of the input signal VIN and a voltage level of the selected reference signal VC at a point in time at which the comparison signal CS is transitioned from a first logic level to a second logic level in the first comparison mode. The difference voltage VD may be generated by subtracting the residue voltage VS from the selected reference signal VC having the fine voltage level. The level of the difference voltage VD may be between the initial voltage level and the fine voltage level. The switch control signal CONSW may include a first switch control signal CONSW1 and a second switch control signal CONSW2.

The input unit 1110a may include a first input block 1112 and a second input block 1114. The first input block 1112 may selectively provide the input signal VIN to the comparison unit 1120a based on the first switch control signal CONSW1. For example, the first input block 1112 may provide the input signal VIN to the comparison unit 1120a during the first comparison mode, and may not provide the input signal VIN to the comparison unit 1120a during the second comparison mode.

In one or more embodiments, the first input block 1112 may include a first switch S11. The first switch S11 may selectively connect an input terminal of the input signal VIN to a first input terminal (i.e., a first node N11) of the comparison unit 1120a in response to the first switch control signal CONSW1.

The second input block 1114 may store the residue voltage VS and may provide the selected reference signal VC to the comparison unit 1120a based on the second switch control signal CONSW2 in the first comparison mode. The second input block 1114 may generate the difference voltage VD by subtracting the residue voltage VS from the selected reference signal VC, and may provide the difference voltage VD and the ramp signal VF to the comparison unit 1120a based on the second switch control signal CONSW2 in the second comparison mode.

In one or more embodiments, the second input block 1114 may include a capacitor C, a second switch S12, and a third switch S13. The capacitor C may be connected between the first input terminal (i.e., the first node N11) of the comparison unit 1120a and an input terminal (i.e., a second node N12) of the selected reference signal VC, and may store the residue voltage VS. The second switch S12 may selectively connect the input terminal N12 of the selected reference signal VC to a second input terminal (i.e., a third node N13) of the comparison unit 1120a in response to an inversion signal /CONSW2 of the second switch control signal CONSW2. The third switch S13 may selectively connect the second input terminal of the comparison unit 1120a to an input terminal of the ramp signal VF in response to the second switch control signal CONSW2.

In one or more embodiments, the first switch S11 and the second switch S12 may be turned on during the first comparison mode, and may be turned off during the second comparison mode. The third switch S13 may be turned off during the first comparison mode, and may be turned on during the second comparison mode.

As described above with reference to FIG. 1, the comparison unit 1120a may compare the input signal VIN with the selected reference signal VC to determine the logic level of the comparison signal CS in the first comparison mode. The comparison unit 1120a may compare the difference voltage VD with the ramp signal VF to determine the logic level of the comparison signal CS in the second comparison mode.

The analog-to-digital converter 1000 including the comparison signal generation unit 1100a of FIG. 2 may perform the analog-to-digital conversion operation based on the difference voltage VD in the second comparison mode. The difference voltage VD may be generated by subtracting the residue voltage VS from the selected reference signal VC, and thus the level of the difference voltage VD may be lower than the voltage level of the original input signal VIN. In addition, the comparison signal generation unit 1100a may be implemented without sampling capacitors. Thus, the analog-to-digital converter 1000 may have low power consumption, low signal conversion time, and enhanced operation speed.

Figure 3:
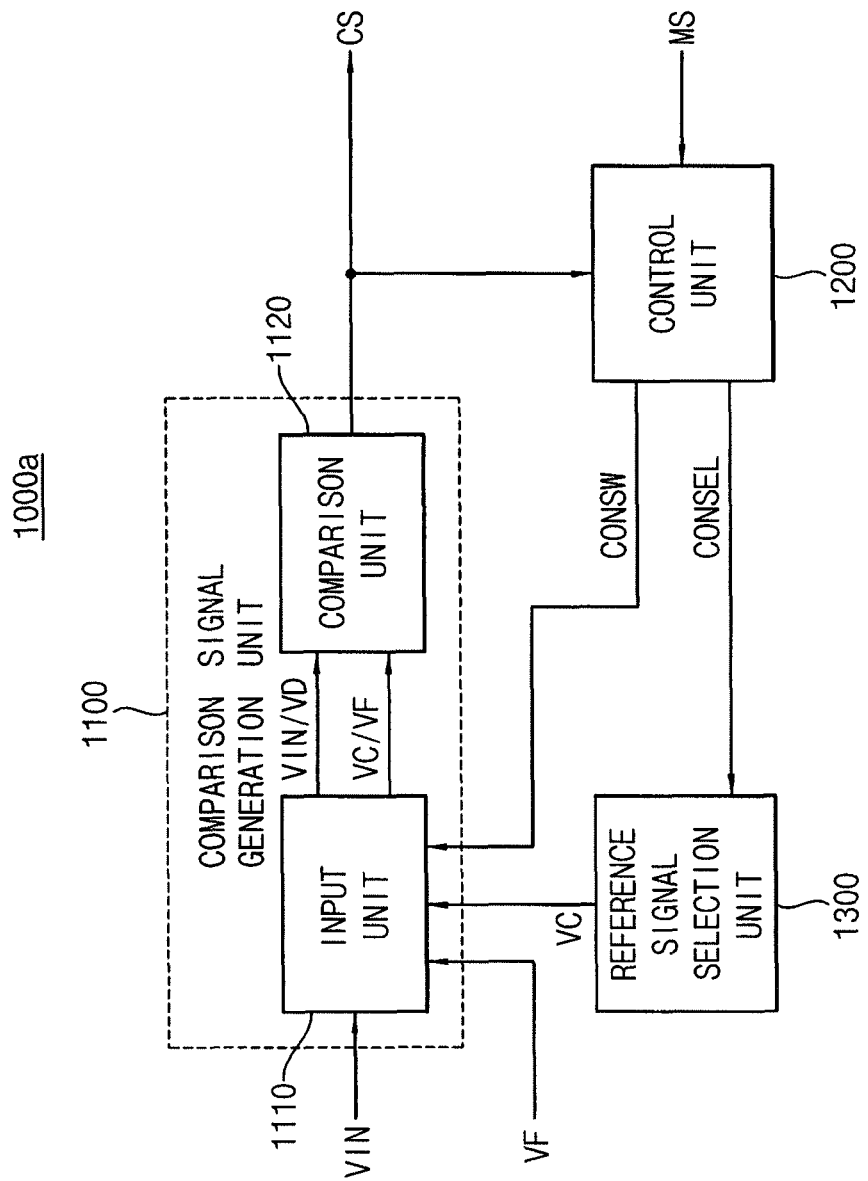
FIG. 3 illustrates a block diagram of another exemplary embodiment of an analog-to-digital converter.

FIG. 3 illustrates a block diagram of another exemplary embodiment of an analog-to-digital converter 1000a.

Referring to FIG. 3, the analog-to-digital converter 1000a may include the comparison signal generation unit 1100, the control unit 1200, and a reference signal selection unit 1300. In general, only differences between the exemplary analog-to-digital converter 1000 of FIG. 1 and the exemplary analog-to-digital converter 1000a of FIG. 3 will be described below.

In comparison with the analog-to-digital converter 1000 of FIG. 1, the analog-to-digital converter 1000a may further include the reference signal selection unit 1300. The comparison signal generation unit 1100 and the control unit 1200 may operate similar to the comparison signal generation unit 1100 and the control unit 1200 in FIG. 1, respectively. For example, the comparison signal generation unit 1100 may determine the logic level of the comparison signal CS by comparing the input signal VIN with the selected reference signal VC based on the switch control signal CONSW in the first comparison mode, and determines the logic level of the comparison signal CS by comparing the difference voltage VD with the ramp signal VF based on the switch control signal CONSW in the second comparison mode. The control unit 1200 may generate the switch control signal CONSW based on the comparison signal CS and the mode selection signal MS.

The reference signal selection unit 1300 may output the selected reference signal VC by selecting one of a plurality of reference voltages based on a selection control signal CONSEL. The voltage level of the selected reference signal VC may be changed or maintained depending on the comparison mode of the analog-to-digital converter 1000a.

In one or more embodiments, the reference signal selection unit 1300 may change the voltage level of the selected reference signal VC when the selection control signal CONSEL has a first value for updating the selected reference signal VC, and the reference signal selection unit 1300 may not change the selected reference signal VC when the selection control signal CONSEL has a second value for maintaining the selected reference signal VC. For example, during the first period of the first comparison mode, the reference signal selection unit 1300 may sequentially increase or decrease the voltage level of the selected reference signal VC from the initial voltage level to the final voltage level in the step form based on the selection control signal CONSEL having the first value. During the second period of the first comparison mode, the reference signal selection unit 1300 may maintain the voltage level of the selected reference signal VC as the final voltage level based on the selection control signal CONSEL having the second value. During the second comparison mode, the reference signal selection unit 1300 may maintain the voltage level of the selected reference signal VC as the fine voltage level based on the selection control signal CONSEL having the second value.

The difference voltage VD may have the level between a level of a first reference voltage and a level of a second reference voltage. The first and second reference voltage may be two of the reference voltages and may have adjacent voltage levels. The first reference voltage may correspond to the initial voltage level, and the second reference voltage may correspond to the fine voltage level.

The control unit 1200 may further generate the selection control signal CONSEL based on the comparison signal CS and the mode selection signal MS. In an example embodiment, the control unit 1200 may be implemented with at least one logic element that performs a logic operation on the comparison signal CS and the mode selection signal MS to generate the switch control signal CONSW and the selection control signal CONSEL. In one or more embodiments, the control unit 1200 may further receive a clock signal (not illustrated), and the control unit 1200 may be implemented with at least one logic element that performs a logic operation on the comparison signal CS, the mode selection signal MS and the clock signal to generate the switch control signal CONSW and the selection control signal CONSEL. In one or embodiments, the selection control signal CONSEL for updating the selection reference signal VC may correspond to a signal generated by passing the clock signal, and the selection control signal CONSEL for maintaining the selection reference signal VC may correspond to a signal generated by blocking the clock signal.

Figure 4A:
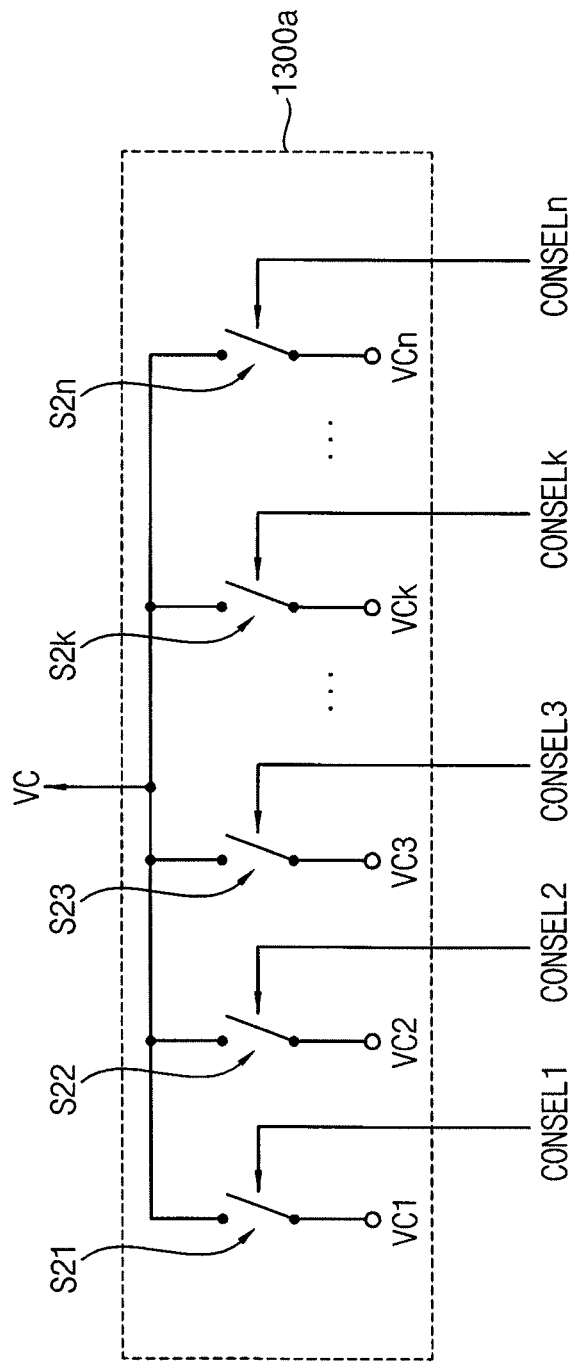
FIG. 4A illustrates a diagram of an exemplary embodiment of a reference signal selection unit employable in the analog-to-digital converter of FIG. 3.

FIG. 4A illustrates a diagram of an exemplary embodiment of a reference signal selection unit 1300a employable in the analog-to-digital converter 1000a of FIG. 3.

Referring to FIG. 4A, the reference signal selection unit 1300a may include first through n-th switches S21, S22, S23, . . . , S2k, . . . , S2n, where n is a natural number equal to or greater than two, and where k is equal to or greater than one and equal to or smaller than n. The selection control signal CONSEL may include first through n-th selection control signals CONSEL1, CONSEL2, CONSEL3, . . . , CONSELk, . . . , CONSELn.

The reference signal selection unit 1300a may output the selected reference signal VC by selecting one of the reference voltages VC1, VC2, VC3, . . . , VCk, . . . , VCn based on the plurality of selection control signals CONSEL1, . . . CONSELn. The reference signal selection unit 1300a may receive the plurality of reference voltages VC1, . . . , VCn from the reference voltage generator, which may be disposed in or out of the analog-to-digital converter 1000a. The reference voltages may include first through n-th reference voltages VC1, . . . , VCn. The first through n-th reference voltages VC1, . . . , VCn may be increased or decreased by a predetermined voltage level (e.g., by dV in FIG. 8A) as n increases.

Each of the switches S21, . . . , S2n may be connected between a respective one of input terminals of the reference voltages VC1, . . . , VCn and an output terminal of the reference signal selection unit 1300a. Each of the switches S21, . . . , S2n may selectively provide a respective one of the reference voltages VC1, . . . , VCn to the output terminal of the reference signal selection unit 1300a based on a respective one of the selection control signals CONSEL1, . . . CON- SELn. For example, the first switch S21 may be connected between an input terminal of the first reference voltage VC1 and the output terminal of the reference signal selection unit 1300a, and may selectively provide the first reference voltage VC1 to the output terminal of the reference signal selection unit 1300a based on the first selection control signal CONSEL1. When the first selection control signal CONSEL1 is activated, the reference signal selection unit 1300a may output the first reference voltage VC1 as the selected reference signal VC.

In an example embodiment, the voltage level of the selected reference signal VC may be changed or not changed depending on the comparison mode of the analog-to-digital converter 1000a. During the first period of the first comparison mode, the voltage level of the selected reference signal VC may be sequentially updated from the initial voltage level to the final voltage level based on the selection control signals CONSEL1, . . . CONSELn for updating the selected reference signal VC. For example, the initial voltage level may be a level of the first reference voltage VC1, and the voltage level of the selected reference signal VC may be sequentially updated in order of, for example, the level of the first reference voltage VC1, a level of the second reference voltage VC2, a level of the third reference voltage VC3, etc. During the second period of the first comparison mode, the voltage level of the selected reference signal VC may be maintained as the final voltage level based on the selection control signals CONSEL1, . . . CONSELn for maintaining the selected reference signal VC. For example, the final voltage level may be a level of the k-th reference voltage VCk. During the second comparison mode, the voltage level of the selected reference signal VC may be maintained as the fine voltage level based on the selection control signals CONSEL1, . . . CONSELn for maintaining the selected reference signal VC. For example, the fine voltage level may be the level of the second reference voltage VC2.

In one or more embodiments, the selection control signal CONSEL may be a digital signal having n bits. In this case, each of the selection control signals CONSEL1, . . . CONSELn may correspond to one bit of the selection control signal CONSEL.

Figure 4B:
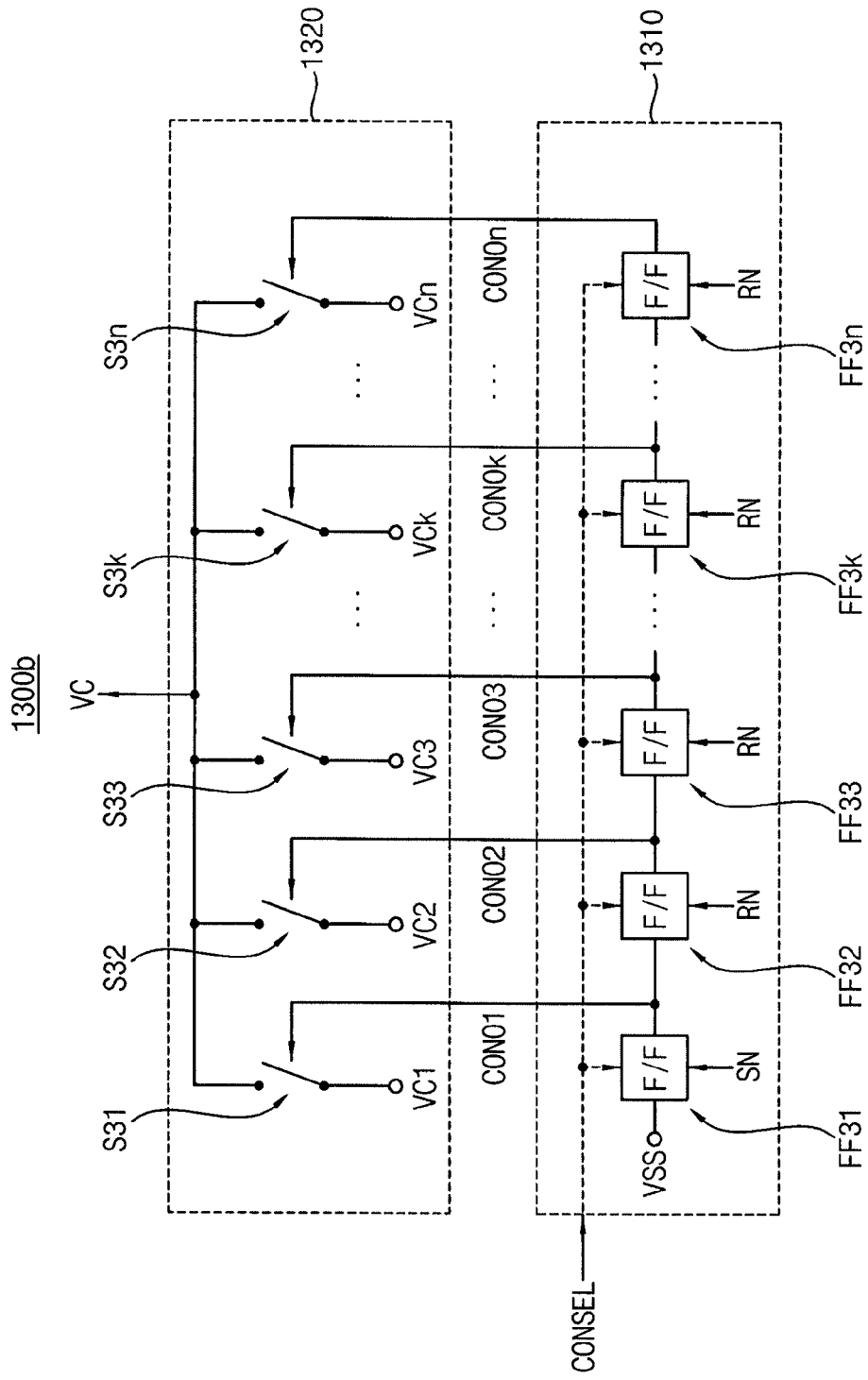
FIG. 4B illustrates a diagram of another exemplary embodiment of the reference signal selection unit employable in the analog-to-digital converter of FIG. 3.

FIG. 4B illustrates a diagram a diagram of another exemplary embodiment of a reference signal selection unit 1300b employable in the analog-to-digital converter 1000a of FIG. 3. Referring to FIG. 4B, the reference signal selection unit 1300b may include a reference signal control block 1310 and a reference signal output block 1320.

The reference signal control block 1310 may generate first through n-th output control signals CONO1, CONO2, CONO3, . . . , CONOk, . . . , CONOn for selecting the selected reference signal VC based on the selection control signal CONSEL. In an example embodiment, the reference signal control block 1310 may be implemented with a shift register having first through n-th flip-flops FF31, FF32, FF33 . . . , FF3k, . . . , FF3n. The first through n-th flip-flops FF31, . . . , FF3n may be cascaded-connected from the first flip-flop FF31 to the n-th flip-flop FF3n. For example, an input terminal of the second flip-flop FF32 may be connected to an output terminal of the first flip-flop FF31, an input terminal of the third flip-flop FF33 may be connected to an output terminal of the second flip-flop FF32, and an input terminal of the n-th flip-flop FF3n may be connected to an output terminal of the (n−1)-th flip-flop.

The reference signal control block 1310 may change the selected reference signal VC by changing the first through n-th output control signals CONO1, . . . CONOn when the selection control signal CONSEL for updating the selected reference signal VC is input from the control unit 1200. The reference signal control block 1310 may not change the selected reference signal VC by maintaining the first through n-th output control signals CONO1, . . . CONOn when the selection control signal CONSEL for maintaining the selected reference signal VC is input from the control unit 1200. For example, in the reference signal control block 1310, when the selection control signal CONSEL for updating the selected reference signal VC is input (e.g., during the first period of the first comparison mode), the first through n-th flip-flops FF31, . . . , FF3n may output internal data based on a rising edge or a falling edge of the clock signal (not illustrated).

More particularly, e.g., initial data VSS having a logic low level may be input to an input terminal of the first flip-flop FF31, the internal data having a logic high level may be stored in the first flip-flop FF31 based on a first initial control voltage SN, and the internal data having the logic low level may be stored in the second through n-th flip-flops FF32, . . . FF3n based on a second initial control voltage RN. Subsequently, the internal data having the logic high level stored in the first flip-flop FF31 may be sequentially transferred to the second through n-th flip-flops FF32, . . . FF3n at the rising edge or the falling edge of the clock signal when the selection control signal CONSEL for updating the selected reference signal VC is input. Assuming that n is 5, logic levels of the internal data stored in the first through fifth flip-flops FF31 through FF35 may be changed in order of, for example, 10000, 01000, 00100, 00010, and 00001.

The reference signal output block 1320 may output the selected reference signal VC by selecting one of the reference voltages VC1, VC2, VC3, . . . , VCk, . . . , VCn based on the output control signals CONO1, . . . CONOn. The reference signal output block 1320 in FIG. 4B may have a structure that is similar to the structure of the reference signal selection unit 1300a of FIG. 4a. For example, the reference signal output block 1320 first through n-th switches S31, S32, S33, . . . , S3k, . . . , S3n. Each of the switches S31, S32, S33, . . . , S3k, . . . , S3n may selectively provide a respective one of the reference voltages VC1, . . . , VCn to the output terminal of the reference signal selection unit 1300b based on a respective one of the output control signals CONO1, . . . CONOn.

Figure 5:
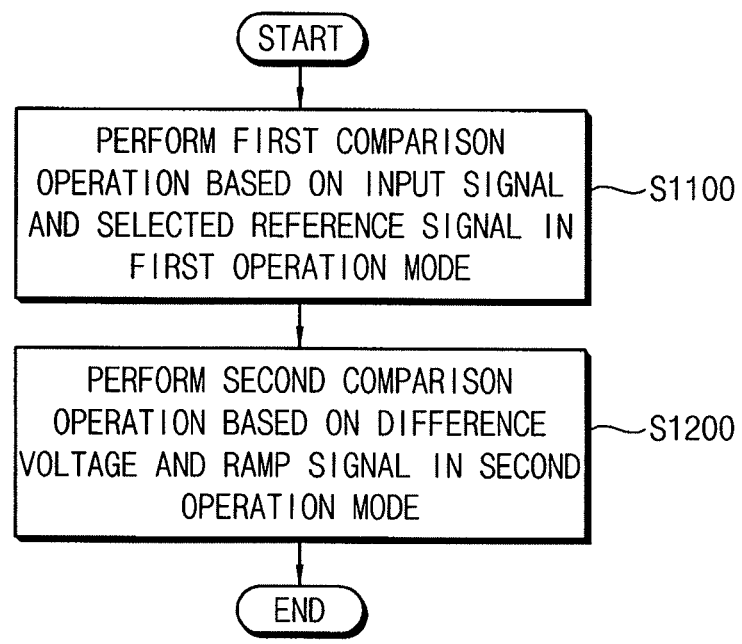
FIG. 5 illustrates a flow chart of an exemplary embodiment of a method of converting an analog signal into a digital signal.

FIG. 5 illustrates a flow chart of an exemplary embodiment of a method of converting an analog signal into a digital signal.

Referring to FIGS. 1 and 5, in one or more embodiments of a method of converting the analog signal into the digital signal, the first comparison operation (e.g., the coarse comparison operation) may be performed based on the input signal VIN and the selected reference signal VC in the first comparison mode (S1100). The second comparison operation (e.g., the fine comparison operation) may be performed based on the difference voltage VD and the ramp signal VF in the second comparison mode (S1200). The difference voltage VD may be generated based on the input signal VIN and the selected reference signal VC such that the level of the difference voltage VD is lower than the fine voltage level corresponding to the voltage level of the selected reference signal VC in the second comparison mode.

FIG. 6A illustrates a flow chart of an exemplary embodiment of a first comparison operation S1100a employable in the method of FIG. 5.

Referring to FIGS. 1, 2 and 6A, in S1100a, the selected reference signal VC may be received from the reference voltage generator (S1105). As discussed above, the selected reference signal VC may be sequentially changed. For example, the voltage level of the selected reference signal VC may be increased or decreased from the initial voltage level to the final voltage level by the predetermined voltage level per the predetermined time period during the first comparison mode.

The logic level of the comparison signal CS may be determined by comparing the input signal VIN with the selected reference signal VC (S1115). The logic level of the comparison signal CS may be checked to determine whether the logic level of the comparison signal CS is transitioned from the first logic level to the second logic level (S1125). If the logic level of the comparison signal CS is not transitioned from the first logic level to the second logic level, S1115 may be repeated. If the logic level of the comparison signal CS is transitioned from the first logic level to the second logic level, the input signal VIN may be blocked and the residue voltage VS corresponding to the input signal VIN may be stored (S1135). For example, the residue voltage VS may correspond to the difference between the voltage level of the input signal VIN and the voltage level of the selected reference signal VC at the point in time at which the comparison signal CS is transitioned from the first logic level to the second logic level in the first comparison mode. The upper bits of the digital signal corresponding to the input signal VIN may be calculated based on the comparison signal CS (S1145).

Figure 6B:
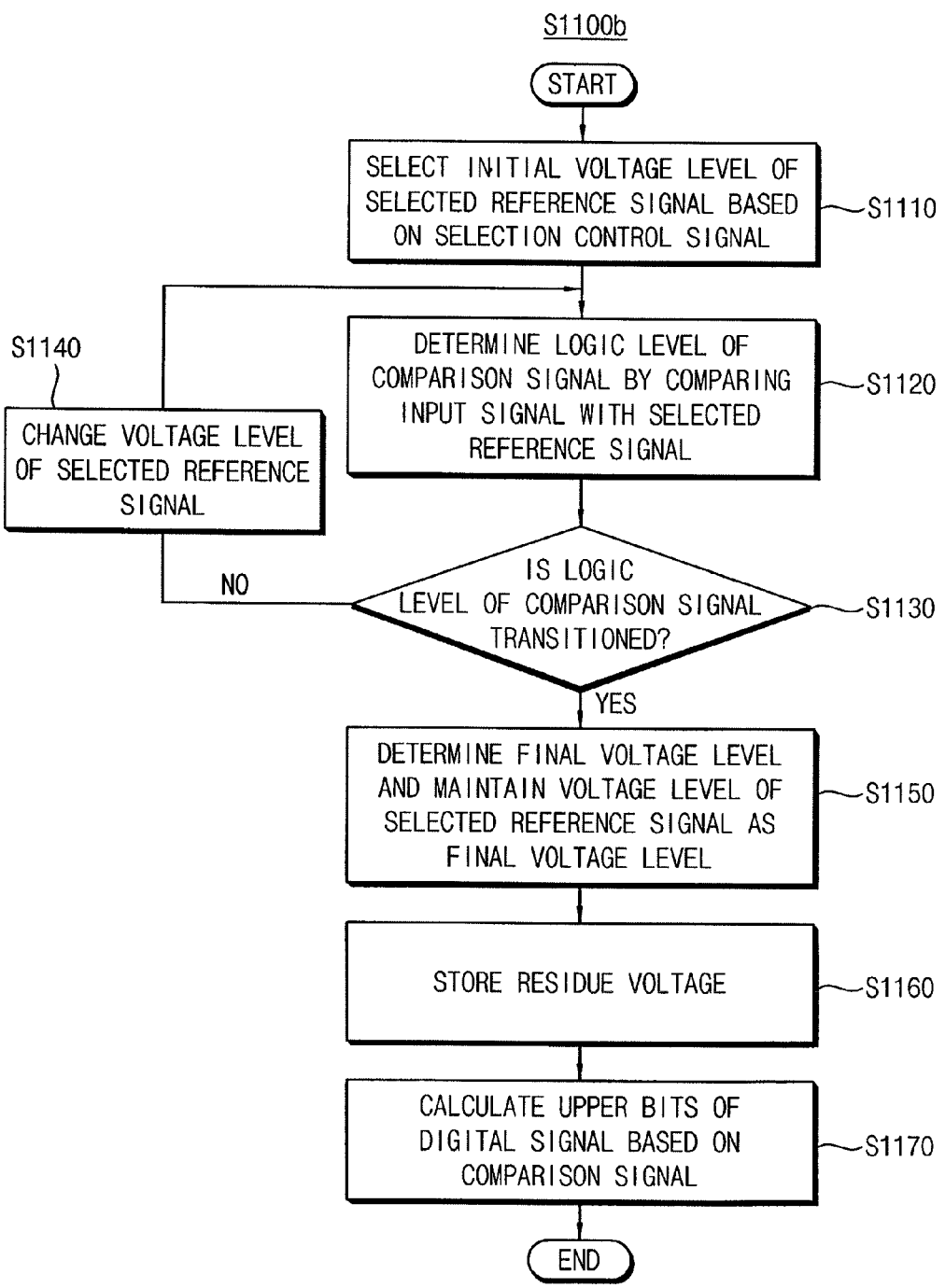
FIG. 6B illustrates a flow chart of another exemplary embodiment of a first comparison operation employable in the method of FIG. 5.

FIG. 6B illustrates a flow chart illustrating another example of the first comparison operation S1100b of FIG. 5.

Referring to FIGS. 3, 4A, 4B and 6B, in S1100b, the initial voltage level of the selected reference signal VC may be selected based on the selection control signal CONSEL and the reference voltages VC1, ..., VCn (step S1110). The logic level of the comparison signal CS may be determined by comparing the input signal VIN with the selected reference signal VC (step S1120).

The logic level of the comparison signal CS may be checked to determine whether the logic level of the comparison signal CS is transitioned from the first logic level to the second logic level (S1130). If the logic level of the comparison signal CS is not transitioned from the first logic level to the second logic level, the voltage level of the selected reference signal VC may be changed (S1140), and the step S1120 may be repeated. If the logic level of the comparison signal CS is transitioned from the first logic level to the second logic level, the voltage level of the selected reference signal VC at the point in time at which the comparison signal CS transitions from the first logic level to the second logic level may be determined as the final voltage level, and the voltage level of the selected reference signal VC may be maintained as the final voltage level (S1150). The residue voltage VS corresponding to the input signal VIN may be stored (S1160). The upper bits of the digital signal corresponding to the input signal VIN may be calculated based on the comparison signal CS (S1170).

Figure 7:
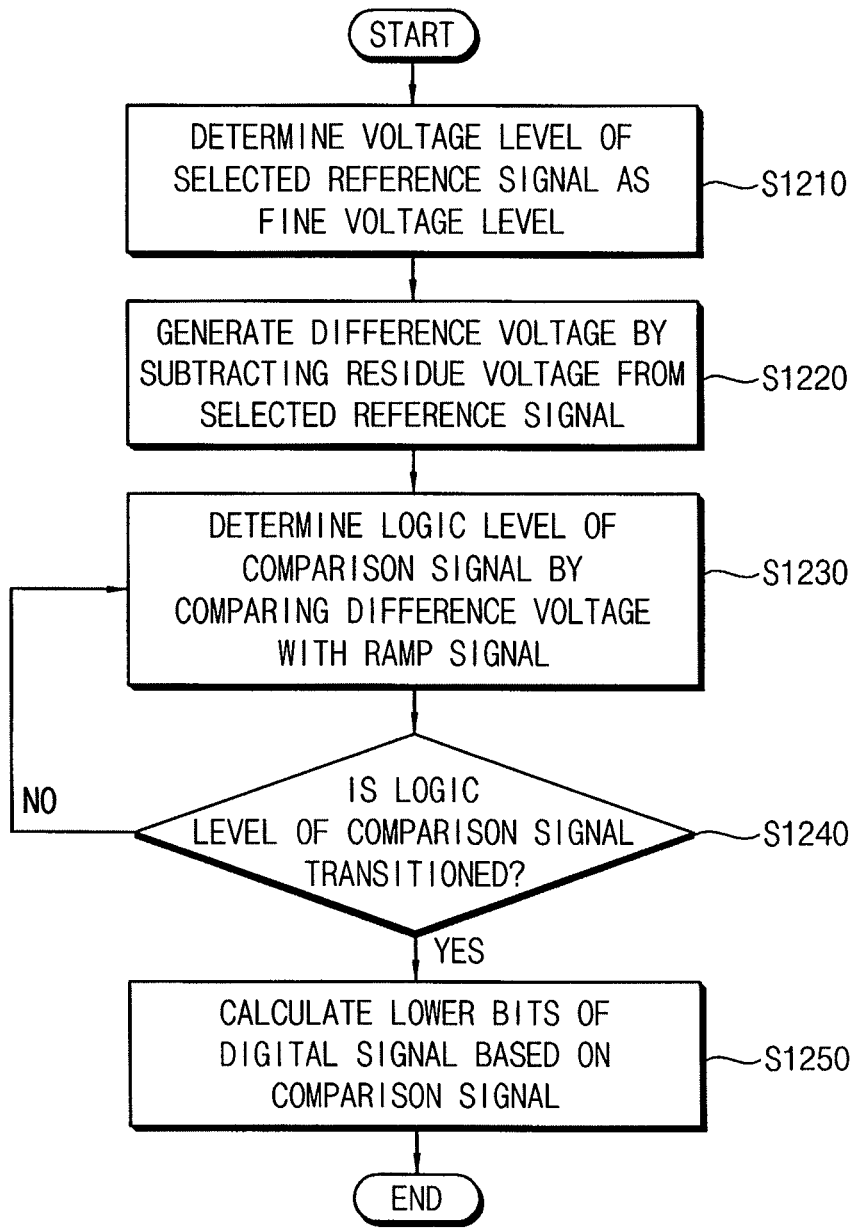
FIG. 7 illustrates a flow chart of an exemplary embodiment of a second comparison operation employable in the method of FIG. 5.

FIG. 7 illustrates a flow chart of an exemplary embodiment of a second comparison operation S1200 employable in the method of FIG. 5.

Referring to FIGS. 1, 2 and 7, in S1200, the voltage level of the selected reference signal VC may be determined as the fine voltage level (S1210). The difference voltage VD may be generated by subtracting the residue voltage VS from the selected reference signal VC (S1220). The level of the difference voltage VD may be between the initial voltage level and the fine voltage level. The logic level of the comparison signal CS may be determined by comparing the difference voltage VD with the ramp signal VF (S1230). The logic level of the comparison signal CS may be checked to determine whether the logic level of the comparison signal CS is transitioned from the second logic level to the first logic level (S1240). If the logic level of the comparison signal CS is not transitioned from the second logic level to the first logic level, S1230 may be repeated. If the logic level of the comparison signal CS is transitioned from the second logic level to the first logic level, the lower bits of the digital signal corresponding to the input signal VIN may be calculated based on the comparison signal CS (S1250).

Figure 8A:
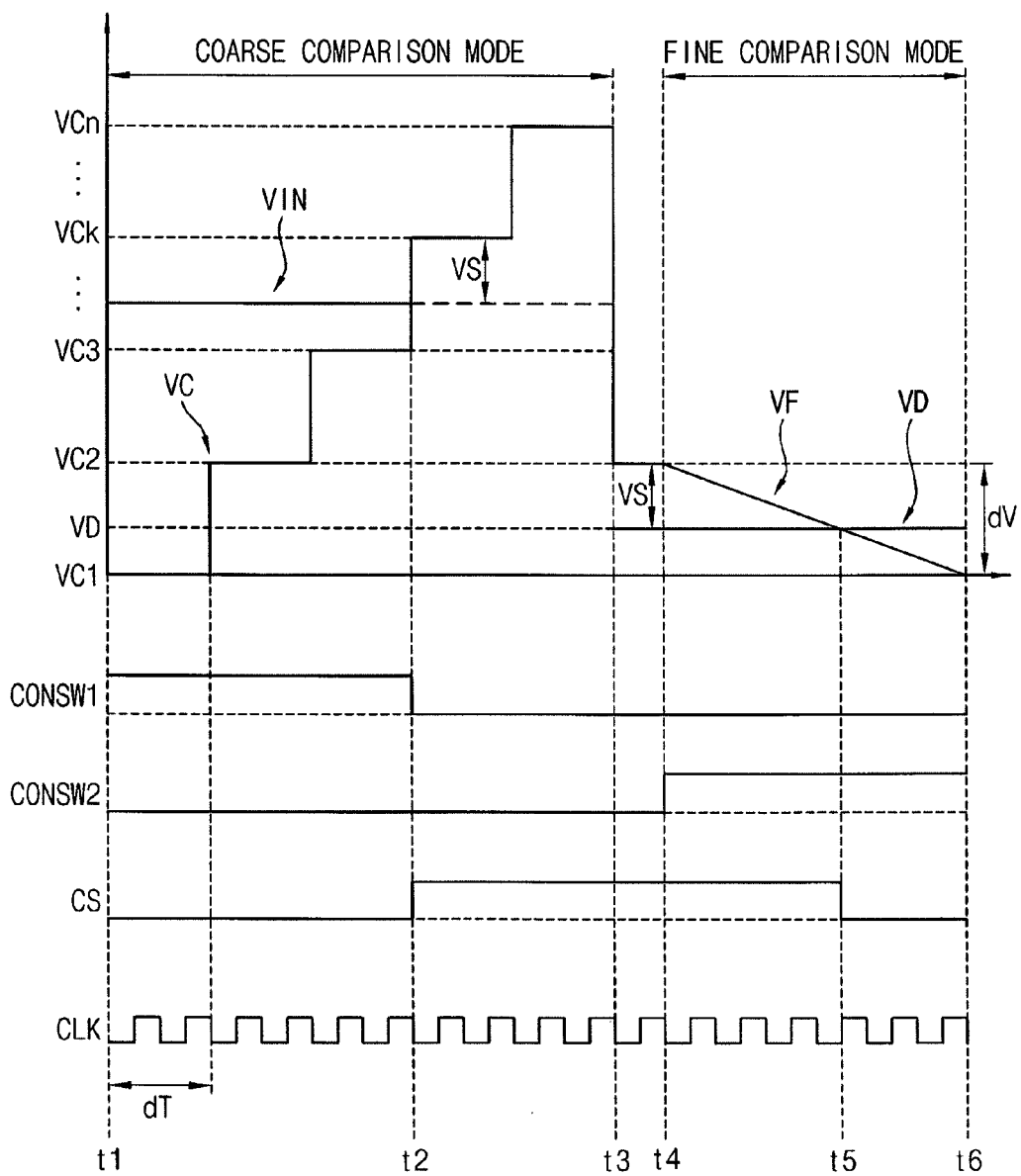
FIGS. 8A, 8B, and 9 illustrate diagrams for describing an exemplary operation of an exemplary embodiment of an analog-to-digital converter.
Figure 8B:
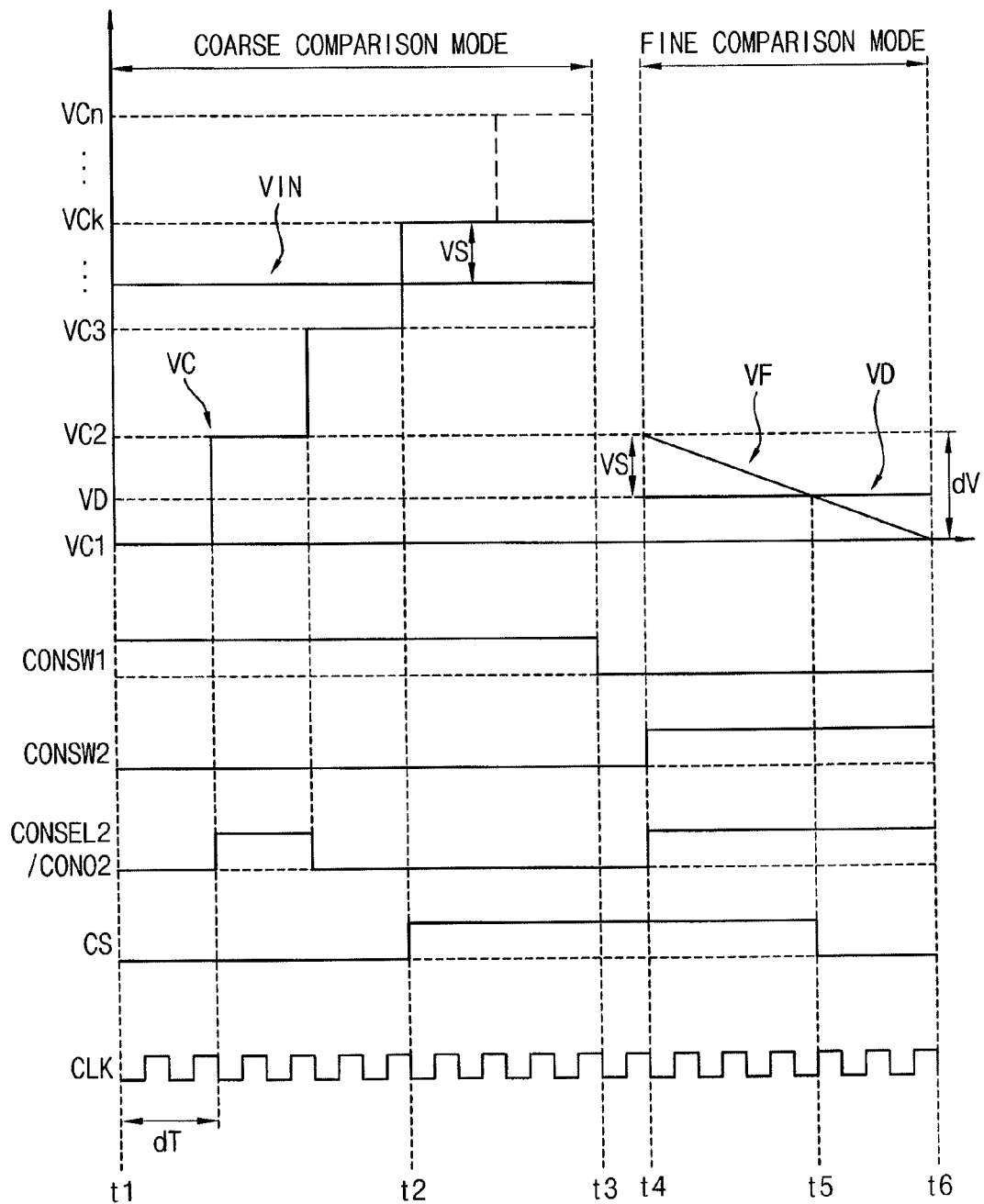
Figure 9:
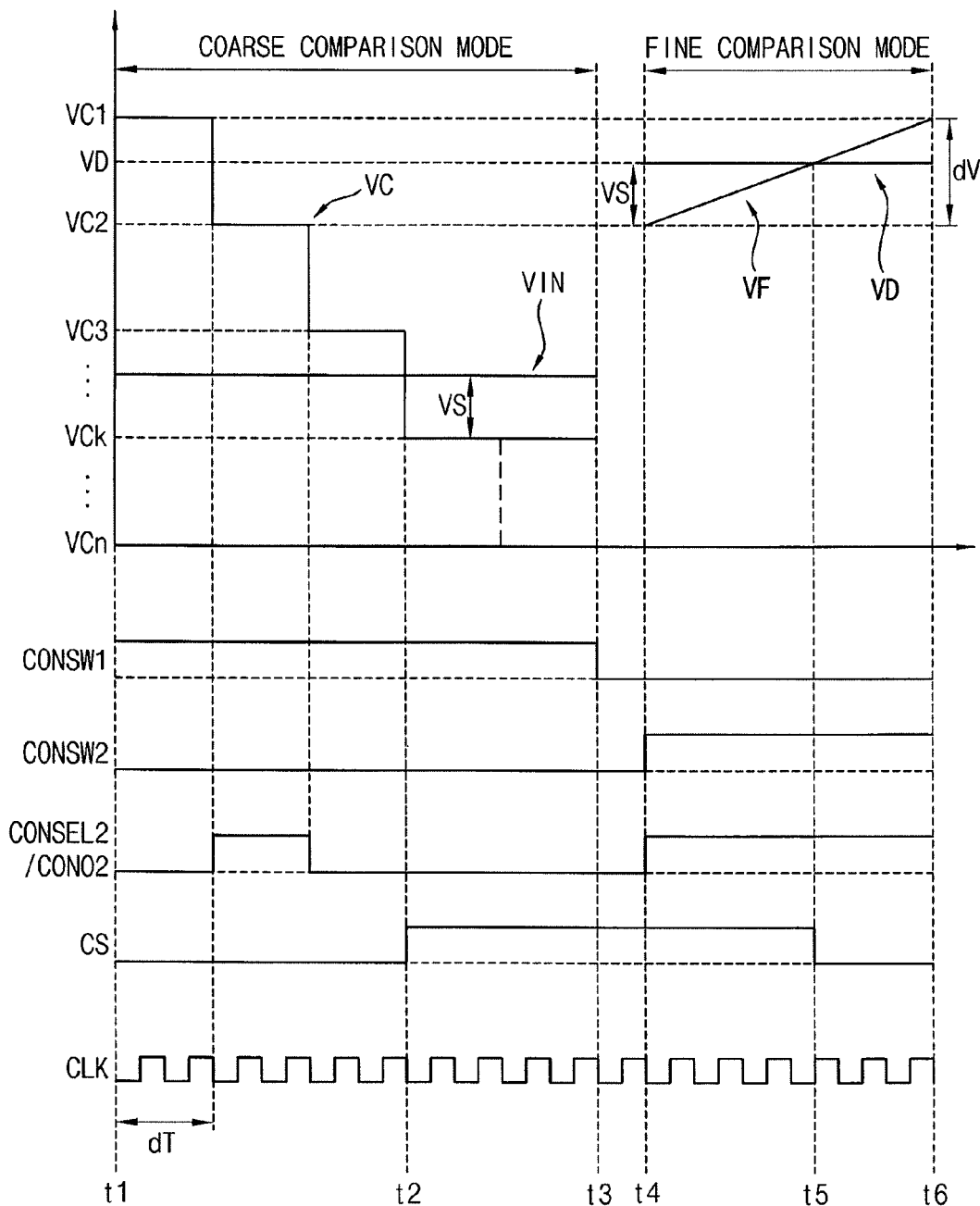

FIGS. 8A, 8B, and 9 illustrate diagrams for describing an exemplary operation of an exemplary embodiment of an analog-to-digital converter, e.g., 1000.

Hereinafter, an exemplary operation of the analog-to-digital converter, e.g., 1000, according to one or more embodiments will be described with reference to FIGS. 1, 2, 5, 6A, 7 and 8A.

As illustrated in FIG. 8A, the analog-to-digital converter 1000 may operate in a dual mode of the coarse comparison mode (from time t1 to time t3) and the fine comparison mode (from time t4 to time t6). A delay (from time t3 to time t4) may exist between the coarse comparison mode and the fine comparison mode due to switching operation of the switches, e.g., S11, S12, and S13 in the input unit 1110a of FIG. 2. The reference voltages (i.e., the first through n-th reference voltages VC1 through VCn) may be candidates of the selected reference signal VC. The first through n-th reference voltages VC1 through VCn may be increased by the predetermined voltage dV as n increases. The first through n-th reference voltages VC1 through VCn may be sequentially selected as the selected reference signal VC. The initial voltage level of the selected reference signal VC may correspond to the level of the first reference voltage VC1, and the fine voltage level of the selected reference signal VC may correspond to the level of the second reference voltage VC2. The ramp voltage VF may be decreased from the level of the second reference voltage VC2 to the level of the first reference voltage VC1 with a predetermined slope in the fine comparison mode. The clock signal CLK may be input for calculating the upper bits and the lower bits in the coarse comparison mode and the fine comparison mode.

Referring to FIG. 8A, at time t1, the first switch control signal CONSW1 is activated by having a logic high level. The second switch control signal CONSW2 is deactivated by having a logic low level. Accordingly, during t1, the first switch S11 and the second switch S12 are turned on, and the third switch S13 is turned off.

During the coarse comparison mode, the input unit 1110a may receive the selected reference signal VC that is sequentially updated. The voltage level of the selected reference signal VC may be increased from the level of the first reference voltage VC1 to the level of the n-th reference voltage VCn by the predetermined voltage level dV per the predetermined time period dT. The comparison unit 1120a may determine the logic level of the comparison signal CS by comparing the input signal VIN with the selected reference signal VC. The control unit 1200 may check whether the logic level of the comparison signal CS is transitioned from the logic low level to the logic high level.

The coarse comparison mode may be divided into the first period (from time t1 to time t2) and the second period (from time t2 to time t3) depending on the logic level of the comparison signal CS. During the first period of the coarse comparison mode, the logic level of the comparison signal CS may be maintained as the logic low level because the voltage level of the input signal VIN is greater than the voltage level of the selected reference signal VC. For example, when the first reference voltage VC1 is selected as the selected reference signal VC, the first reference voltage VC1 is compared with the input signal VIN, and the comparison signal CS has the logic low level because the input signal VIN is greater than the first reference voltage VC1. Then, when the second reference voltage VC2 is selected as the selected reference signal VC, the second reference voltage VC2 is compared with the input signal VIN, and the comparison signal CS still has the logic low level because the input signal VIN is greater than the second reference voltage VC2. The analog-to-digital converter 1000 repeats such comparing and checking operation per the predetermined time period dT.

At time t2, the k-th reference voltage VCk is selected as the selected reference signal VC. The logic level of the comparison signal CS is transitioned from the logic low level to the logic high level because the input signal VIN is smaller than the k-th reference voltage VCk. The first switch control signal CONSW1 is deactivated by transitioning from the logic high level to the logic low level. The first switch S11 is turned off, and the input unit 1110a blocks the input signal VIN. The input unit 1110a stores the residue voltage VS corresponding to the input signal VIN. The residue voltage VS may be stored in the capacitor C, and may correspond to the difference between the voltage level of the input signal VIN and the voltage level of the selected reference signal VC (i.e., the level of the k-th reference voltage VCk).

During the second period of the coarse comparison mode, the first input terminal of the comparison unit 1120a may receive a voltage that corresponds to (VC-VS). The logic level of the comparison signal CS may be maintained as the logic high level because the voltage level at first input terminal of the comparison unit 1120a is smaller than the voltage level of the selected reference signal VC.

At time t3, the second reference voltage VC2 is selected as the selected reference signal VC. The difference voltage VD is generated by subtracting the residue voltage VS from the voltage level of the selected reference signal VC (i.e., the level of the second reference voltage VC2). The first input terminal of the comparison unit 1120a may receive the difference voltage VD.

At time t4, the second switch control signal CONSW2 may be activated by transitioning from the logic low level to the logic high level. The second switch S12 is turned off, the third switch S13 is turned on, and the second input terminal of the comparison unit 1120a receives the ramp signal VF.

During the fine comparison mode, the comparison unit 1120a determines the logic level of the comparison signal CS by comparing the difference voltage VD with the ramp signal VF. The control unit 1200 checks whether the logic level of the comparison signal CS is transitioned from the logic high level to the logic low level.

The fine comparison mode may be divided into the first period (from time t4 to time t5) and the second period (from time t5 to time t6) depending on the logic level of the comparison signal CS. During the first period of the fine comparison mode, the logic level of the comparison signal CS may be maintained as the logic high level because the voltage level of the ramp signal VF is greater than the level of the difference voltage VD. The analog-to-digital converter 1000 may repeat such comparing and checking operations. At time t5, the logic level of the comparison signal CS is transitioned from the logic high level to the logic low level because the ramp signal VF is the same as the difference voltage VD.

The analog-to-digital converter 1000 may generate a digital signal corresponding to the input signal VIN by counting the clock signal CLK based on the comparison signal CS. For example, the analog-to-digital converter 1000 may calculate the upper bits of the digital signal by counting the clock signal CLK during the first period of the coarse comparison mode, and may calculate the lower bits of the digital signal by counting the clock signal CLK during the second period of the fine comparison mode.

Hereinafter, another exemplary operation of the analog-to-digital converter, e.g., 1000, according to one or more embodiments will be described with reference to FIGS. 1, 2, 5, 6A, 7 and 8B.

As illustrated in FIG. 8B, the analog-to-digital converter 1000a may operate in a dual mode of the coarse comparison mode (from time t1 to time t3) and the fine comparison mode (from time t4 to time t6). A delay (from time t3 to time t4) may exist between the coarse comparison mode and the fine comparison mode due to switching operation of the switches S11, S12, and S13. The reference voltages VC1 through VCn may be candidates of the selected reference signal VC. The reference voltages VC1 through VCn may be increased by the predetermined voltage dV as n increases. The reference voltages VC1 through VCn may be sequentially selected as the selected reference signal VC. The initial voltage level of the selected reference signal VC may correspond to the level of the first reference voltage VC1, the fine voltage level of the selected reference signal VC may correspond to the level of the second reference voltage VC2, and the final voltage level of the selected reference signal VC may correspond to the level of the k-th reference voltage VCk. The ramp voltage VF may be decreased from the level of the second reference voltage VC2 to the level of the first reference voltage VC1 with the predetermined slope in the fine comparison mode. The clock signal CLK may be input for calculating the upper bits and the lower bits in the coarse comparison mode and the fine comparison mode.

At time t1, the first switch control signal CONSW1 is activated by having the logic high level. The second switch control signal CONSW2 is deactivated by having the logic low level. The first switch S11 and the second switch S12 are turned on, and the third switch S13 is turned off.

During the coarse comparison mode, the input unit 1110a may provide the input signal VIN and the selected reference signal VC to the comparison unit 1120a. The comparison unit 1120a may determine the logic level of the comparison signal CS by comparing the input signal VIN with the selected reference signal VC. The control unit 1200 may check whether the logic level of the comparison signal CS is transitioned from the logic low level to the logic high level. The reference signal selection unit 1300 may output the selected reference signal CS by selecting one of the reference voltages VC1 through VCn based on the selection control signal CONSEL.

During the first period of the coarse comparison mode, the logic level of the comparison signal CS may be maintained as the logic low level because the voltage level of the input signal VIN is greater than the voltage level of the selected reference signal VC. The reference signal selection unit 1300 may select the first reference voltage VC1 as the selected reference signal VC based on the selection control signal CONSEL. The first reference voltage VC1 may be compared with the input signal YIN, and the comparison signal CS has the logic low level because the input signal VIN is greater than the first reference voltage VC1. Then, the control unit 1200 may generate the selection control signal CONSEL for updating the selected reference signal VC. For example, the control unit 1200 may only activate the second selection control signal CONSEL2 (in FIG. 4A), or may provide the selection control signal CONSEL for only activating the second output control signal CONO2 (in FIG. 4B). The reference signal selection unit 1300 may change the selected reference signal VC based on the selection control signal CONSEL for updating the selected reference signal VC. The voltage level of the selected reference signal VC may be changed from the level of the first reference voltage VC1 to the level of the second reference voltage VC2 (e.g., fine voltage level). The second reference voltage VC2 may be compared with the input signal VIN, and the comparison signal CS still has the logic low level because the input signal VIN is greater than the second reference voltage VC2. The analog-to-digital converter 1000*a* may repeat such comparing, checking, and changing operation per the predetermined time period dT.

At time t2, the reference signal selection unit 1300 selects the k-th reference voltage VCk as the selected reference signal VC. The logic level of the comparison signal CS is transitioned from the logic low level to the logic high level because the input signal VIN is smaller than the k-th reference voltage VCk. Then, the control unit 1200 may generate the selection control signal CONSEL for maintaining the selected reference signal VC. The voltage level of the selected reference signal VC is maintained as the k-th reference voltage VCk. The input unit 1110*a* stores the residue voltage VS corresponding to the difference between the voltage level of the input signal VIN and the level of the k-th reference voltage VCk.

During the second period of the coarse comparison mode, the logic level of the comparison signal CS may be maintained as the logic high level because the input signal VIN is smaller than the selected reference signal VC (i.e., the k-th reference voltage VCk).

At time t3, the first switch control signal CONSW1 is deactivated by transitioning from the logic high level to the logic low level. The first switch S11 is turned off, and the input unit 1110*a* blocks the input signal VIN.

At time t4, the control unit 1200 generates the selection control signal CONSEL for maintaining the selected reference signal VC. The voltage level of the selected reference signal VC is maintained as the second reference voltage VC2. For example, the control unit 1200 may only activate the second selection control signal CONSEL2 (in FIG. 4A), or may provide the selection control signal CONSEL for only activating the second output control signal CONO2 (in FIG. 4B). In addition, the second switch control signal CONSW2 is activated by transitioning from the logic low level to the logic high level. The second switch S12 is turned off, the third switch S13 is turned on, and the second input terminal of the comparison unit 1120*a* receives the ramp signal VF.

During the fine comparison mode, the comparison unit 1120*a* may determine the logic level of the comparison signal CS by comparing the difference voltage VD with the ramp signal VF. The control unit 1200 may check whether the logic level of the comparison signal CS is transitioned from the logic high level to the logic low level. The operation of the analog-to-digital converter 1000*a* in the fine comparison mode in FIG. 8B may be substantially the same as the operation of the analog-to-digital converter 1000*a* in the fine comparison mode in FIG. 8A.

Hereinafter, an exemplary operation of the analog-to-digital converter, e.g., 1000, according to one or more embodiments will be described with reference to FIGS. 1, 2, 5, 6A, 7 and 9.

As illustrated in FIG. 9, the reference voltages VC1 through VCn may be decreased by the predetermined voltage dV as n increases. The ramp voltage VF may be increased from the level of the second reference voltage VC2 to the level of the first reference voltage VC1 with the predetermined slope in the fine comparison mode.

During the coarse comparison mode, the logic level of the comparison signal CS may be determined by comparing the input signal VIN and the selected reference signal VC. During the first period of the coarse comparison mode, the logic level of the comparison signal CS may be maintained as the logic low level because the voltage level of the input signal VIN is smaller than the voltage level of the selected reference signal VC. The control unit 1200 may generate the selection control signal CONSEL for updating the selected reference signal VC, and the reference signal selection unit 1300 changes the selected reference signal VC based on the selection control signal CONSEL for updating the selected reference signal VC. The analog-to-digital converter 1000*a* may repeat such comparing, checking, and changing operation per the predetermined time period dT.

At time t2, the logic level of the comparison signal CS is transitioned from the logic low level to the logic high level because the input signal VIN is smaller than the selected reference signal VC (i.e., the k-th reference voltage VCk). During the second period of the coarse comparison mode, the voltage level of the selected reference signal VC is maintained as the k-th reference voltage VCk. The input unit 1110*a* stores the residue voltage VS corresponding to the difference between the voltage level of the input signal VIN and the level of the k-th reference voltage VCk.

At time t3, the first switch control signal CONSW1 is transitioned from the logic high level to the logic low level. At time t4, the second switch control signal CONSW2 is transitioned from the logic low level to the logic high level. The voltage level of the selected reference signal VC is maintained as the second reference voltage VC2 (e.g., fine voltage level).

During the fine comparison mode, the comparison unit 1120*a* determines the logic level of the comparison signal CS by comparing the difference voltage VD with the ramp signal VF. The difference voltage VD is generated by adding the residue voltage VS to the voltage level of the selected reference signal VC (i.e., the level of the second reference voltage VC2).

During the first period of the fine comparison mode, the logic level of the comparison signal CS may be maintained as the logic high level because the voltage level of the ramp signal VF is greater than the level of the difference voltage VD. The analog-to-digital converter 1000 may repeat such comparing and checking operation. At time t5, the logic level of the comparison signal CS is transitioned from the logic high level to the logic low level because the ramp signal VF is the same as the difference voltage VD.

Figure 10:
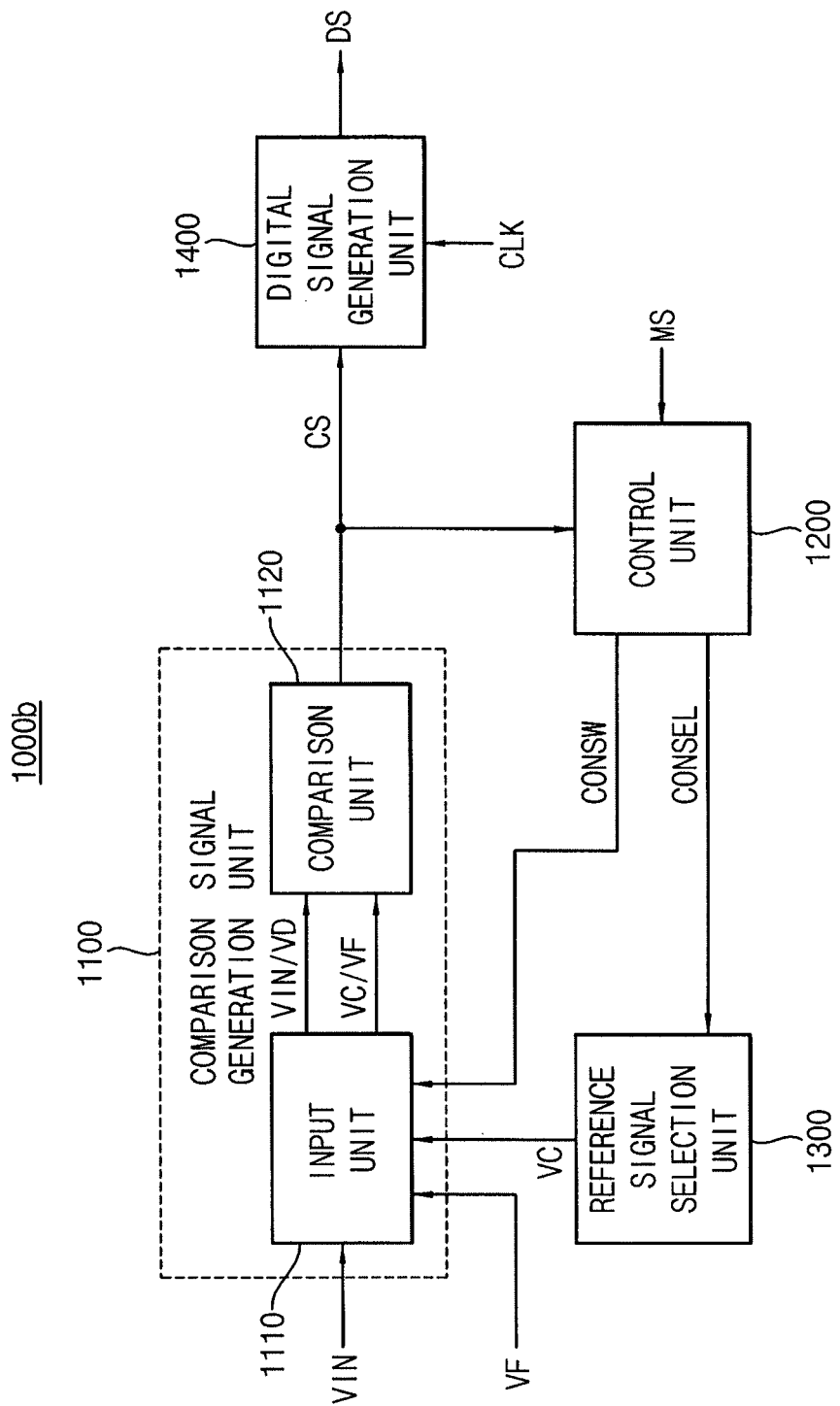
FIG. 10 illustrates a block diagram of another exemplary embodiment of an analog-to-digital converter.

FIG. 10 illustrates a block diagram of another exemplary embodiment of an analog-to-digital converter 1000*b*.

Referring to FIG. 10, the analog-to-digital converter 1000*b* may include the comparison signal generation unit 1100, the control unit 1200, a reference signal selection unit 1300, and a digital signal generation unit 1400. In general, only differences between the exemplary analog-to-digital converter 1000*a* of FIG. 3 and the exemplary analog-to-digital converter 1000*b* of FIG. 10 will be described below. In comparison with the analog-to-digital converter 1000*a* of FIG. 3, the analog-to-digital converter 1000*b* may further include the digital signal generation unit 1400.

The comparison signal generation unit 1100, the control unit 1200 and the reference signal selection unit 1300 may operate similarly to the comparison signal generation unit 1100, the control unit 1200, and the reference signal selection unit 1300 in FIG. 3, respectively. For example, the reference signal selection unit 1300 may output the selected reference signal VC by selecting one of reference voltages based on the selection control signal CONSEL. The comparison signal generation unit 1100 may determine the logic level of the comparison signal CS by comparing the input signal VIN and the selected reference signal VC based on the switch control signal CONSW in the first comparison mode, and may determine the logic level of the comparison signal CS by comparing the difference voltage VD with the ramp signal VF based on the switch control signal CONSW in the second comparison mode. The control unit 1200 may generate the switch control signal CONSW and the selection control signal CONSEL based on the comparison signal CS and the mode selection signal MS.

The digital signal generation unit 1400 may generate a digital signal DS corresponding to the input signal VIN by counting the clock signal CLK based on the comparison signal CS (i.e., by using a clock signal count method). For example, the digital signal generation unit 1400 may calculate the upper bits of the digital signal DS by counting the clock signal CLK during the first period of the first comparison mode, may calculate the lower bits of the digital signal DS by counting the clock signal CLK during the second period of the second comparison mode, and may generate the digital signal DS by summing the upper bits and the lower bits. As described above, the coarse comparison mode may be divided into the first period and the second period depending on the logic level of the comparison signal CS, and the fine comparison mode may be divided into the first period and the second period depending on the logic level of the comparison signal CS.

Figure 11:
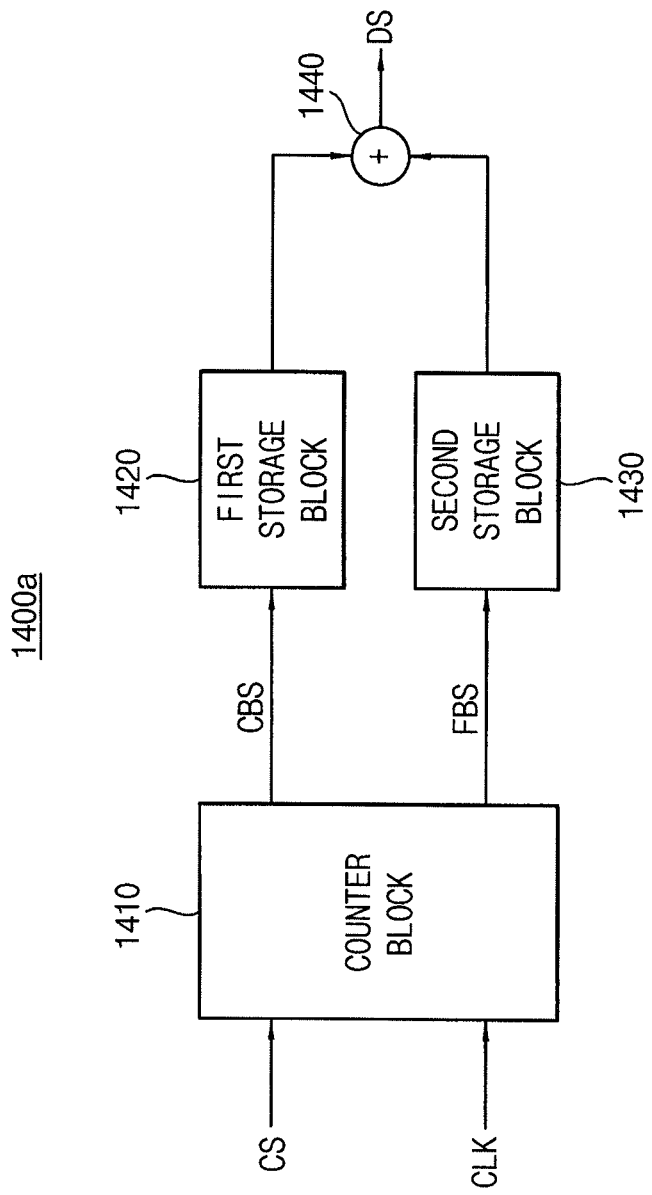
FIG. 11 illustrates a block diagram of an exemplary embodiment of a digital signal generation unit employable in the analog-to-digital converter of FIG. 10.

FIG. 11 illustrates a block diagram of an exemplary embodiment of a digital signal generation unit 1400a employable in the analog-to-digital converter 1000b of FIG. 10.

Referring to FIG. 11, the digital signal generation unit 1400a may include a counter block 1410, a first storage block 1420, a second storage block 1430, and a summation block 1440.

The counter block 1410 may calculate the upper bits CBS and the lower bits FBS by counting the clock signal CLK based on the comparison signal CS. In one or more embodiments, the counter block 1410 may generate the upper bits CBS by counting the clock signal CLK during the first period of the first comparison mode, and may generate the lower bits FBS by counting the clock signal CLK during the second period of the second comparison mode. The first period of the first comparison mode may indicate a time period from the start timing point of the first comparison mode to the first timing point (i.e., at which the comparison signal CS is transitioned from the first logic level to the second logic level in the first comparison mode). The second period of the second comparison mode may indicate a time period from the second timing point (i.e., at which the comparison signal CS is transitioned from the second logic level to the first logic level in the second comparison mode) to the end timing point of the second comparison mode.

Since the analog-to-digital converter 1000b may operate a dual mode of the first comparison mode and the second comparison mode, the counter block 1410 may calculate the upper bits CBS of the digital signal DS in the first comparison mode, and may calculate the lower bits FBS of the digital signal DS in the second comparison mode. For example, assuming that the analog pixel signal (i.e., the input signal VIN) is converted into the digital signal DS of eight bits, upper four bits CBS may be calculated in the first comparison mode, and lower four bits FBS may be calculated in the second comparison mode.

The first storage block 1420 may store the upper bits CBS in the first comparison mode. The second storage block 1430 may store the lower bits FBS in the second comparison mode.

The analog-to-digital converter 1000b may enable the counter block 1410 and the first storage block 1420 in the first comparison mode, and may enable the counter block 1410 and the second storage block 1430 in the second comparison mode. For example, when the counter block 1410 generates the upper bits CBS by counting the clock signal CLK during the first period of the first comparison mode, the first storage block 1420 may store the upper bits CBS. When the counter block 1410 generates the lower bits FBS by counting the clock signal CLK during the second period of the second comparison mode, the second storage block 186 may store the lower bits FBS. The first storage block 1420 and the second storage block 1430 may be implemented with a plurality of storage devices such as latches, flip-flops, etc.

The summation block 1440 may generate the digital signal DS by summing the upper bits CBS output from the first storage block 1420 and the lower bits FBS output from the second storage block 1430. Then, the digital signal DS may be displayed as an image by a DSP circuit of an image sensor.

Figure 12:
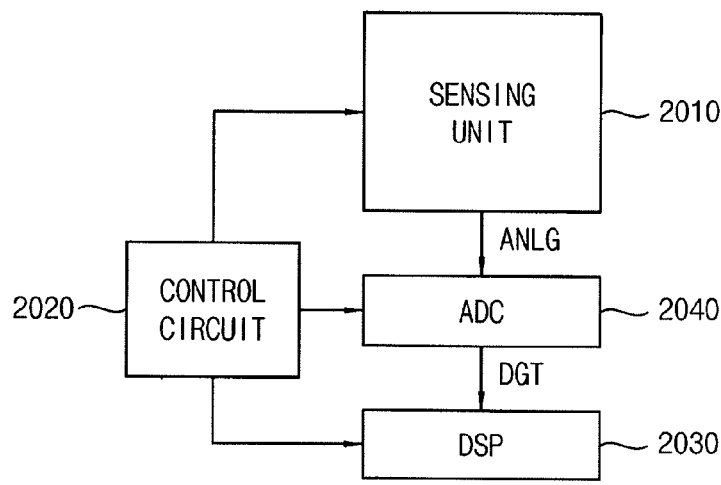
FIG. 12 illustrates a block diagram of an exemplary embodiment of an apparatus including an exemplary embodiment of analog-to-digital converter.

FIG. 12 illustrates a block diagram of an exemplary embodiment of an apparatus 2000 including an exemplary embodiment of analog-to-digital converter 2040.

Referring to FIG. 12, the apparatus 2000 includes a sensing unit 2010, an analog-to-digital converter 2040, and a control circuit 2020.

The sensing unit 2010 may measure a physical quantity to generate an analog signal ANLG corresponding to the measured physical quantity. The analog-to-digital converter 2040 may determine the logic level of the comparison signal CS by comparing the analog signal ANLG and the selected reference signal VC in the first comparison mode, determine the logic level of the comparison signal CS by comparing the difference voltage VD with the ramp signal VF in the second comparison mode, and generate a digital signal DGT corresponding to the analog signal ANLG. The analog-to-digital converter 2040 may receive the selected reference signal VC and the ramp signal VF from a reference voltage generator (not illustrated) that is located inside or outside the apparatus 2000. The analog-to-digital converter 2040 may be, e.g., the analog-to-digital converter 1000 of FIG. 1, the analog-to-digital converter 1000a of FIG. 3, and the analog-to-digital converter 1000b of FIG. 10. The analog-to-digital converter 2040 may perform such conversion operation by using the comparison signal generation unit 1100 and the control unit 1200. The control circuit 2020 may control operations of the sensing unit 2010 and the analog-to-digital converter 2040.

The sensing unit 2010 may measure a physical quantity such as light intensity, sound intensity, time, etc., convert the measured physical quantity into the analog signal ANLG, and output the analog signal ANLG. The apparatus 2000 including such sensing unit 2010 may be arbitrary electronic devices such as a charge coupled device (CCD) image sensor, a complementary metal oxide semiconductor (CMOS) image sensor, a digital camera including the image sensor, an acoustimeter, a computing system, etc. The apparatus 2000 may further include a digital signal processor (DSP) 2030 for processing the digital signal DGT, which may be disposed in or out of the apparatus 2000.

Hereinafter, an example of the apparatus 2000 embodied as an image sensor adapted to perform correlated double sampling is described in further detail.

FIGS. 13, 14, 15, and 16 illustrate block diagrams of exemplary embodiments of image sensors 2100, 2200, 2300, 2400 including exemplary embodiments of analog-to-digital conversion circuits 2040, 2170, 2270, 2370.

Figure 13:
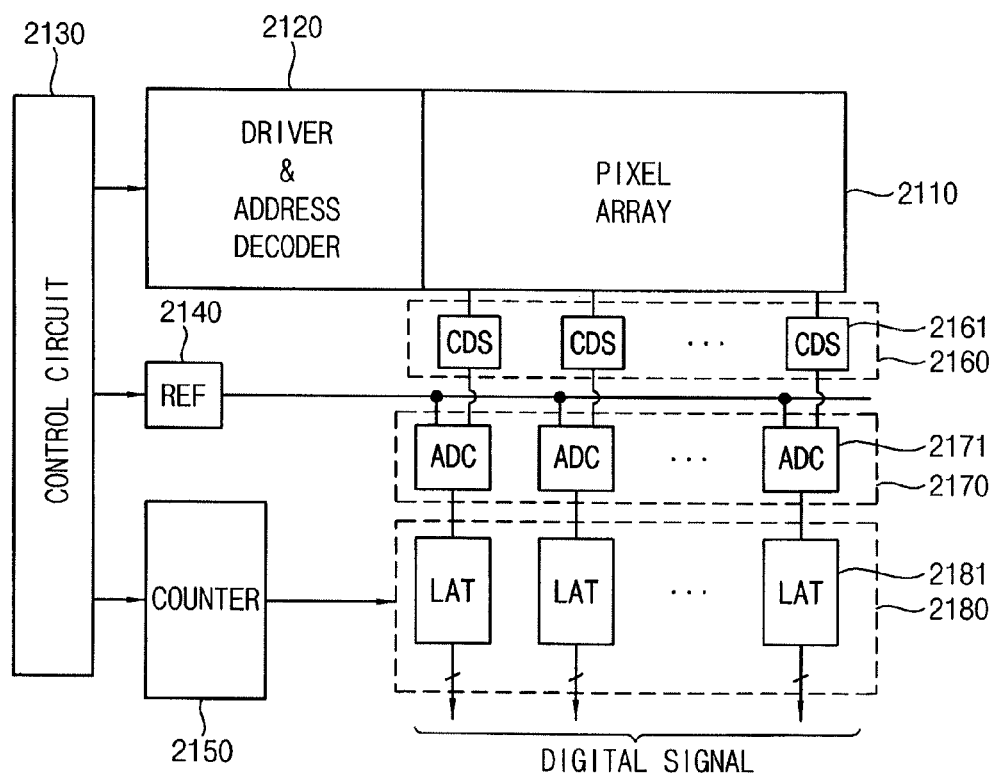
FIGS. 13, 14, 15 and 16 illustrate block diagrams of exemplary embodiments of image sensors including exemplary embodiments of an analog-to-digital converter.

Referring to FIG. 13, the image sensor 2100 includes a pixel array 2110, a driver/address decoder 2120, a control circuit 2130, a reference signal generator 2140, a counter circuit 2150, a correlated double sampling (CDS) circuit 2160, the analog-to-digital conversion circuit 2170, and a latch circuit 2180.

To capture images, image sensors of a CCD type or a CMOS type are widely used for capturing an image by sensing incident lights. The image sensor 2100 of FIG. 13 may be a CCD image sensor, a CMOS image sensor, etc.

In an example of the CMOS image sensor, the pixel array 2110 includes a plurality of unit pixels that are arranged in a matrix form. Each unit pixel may convert an incident light into an electrical analog signal (e.g., analog pixel signal). When the image sensor includes unit pixels referred to as active pixels or gain cells, respective signal from each unit pixel is detected by an address control of the unit pixels. The active pixel sensor may be a kind of address-controlled image sensor, and the driver/address decoder 2120 may control operation of the pixel array 2110 by unit of a column and/or a row. The control circuit 2130 may generate control signals for controlling operations of the other components of the image sensor 2100.

The analog signals detected by the pixel array 2110 may be converted into digital signals by the analog-to-digital conversion circuit 2170, the latch circuit 2180, and the counter circuit 2150. The analog signals are generally output column by column. Thus the CDS circuit 2160, the analog-to-digital conversion circuit 2170 and the latch circuit 2180 include a plurality of CDS units 2161, a plurality of analog-to-digital converters 2171 and a plurality of latches 2181 corresponding to the columns of the pixel array 2110.

The analog signals output from the pixel array include a respective reset signal and a respective measured image signal for each pixel. The respective reset signal may represent respective fixed pattern noise (FPN) for the pixel and a respective logic circuit of the pixel. The respective measured image signal may be generated from the pixel sensing incident light. A final image signal representing the intensity of incident light at each pixel may be indicated by a subtraction of the respective reset signal from the respective measured image signal. Such a final image signal is generated from the CDS procedure.

The CDS circuit 2160 may perform analog double sampling (ADS) by generating a difference between the reset signal and the measured image signal using capacitors and switches. The CDS circuit 2160 may generate analog signals, each being a respective final image signal representing such a difference for each column. The analog-to-digital conversion circuit 2170 may compare the analog image signals for the columns of pixel from the CDS circuit 2160 with the reference signal (e.g., a ramp signal) from the reference signal generator 2140 to generate respective comparison signals for the columns. Each comparison signal may have a respective transition time point that represents the level of the respective analog image signal. The bit signals from the counter 2150 may be commonly provided to all of the latches 2181. Each latch 2181 may latch the bit signals from the counter 2150 at the respective transition time point of the respective comparison signal to generate a respective latched digital signal of the respective final image signal for the respective column.

The analog-to-digital converter 2171 may operate in the single-slope scheme with the two-step. The analog-to-digital converter 2171 may be one of the analog-to-digital converter 1000 of FIG. 1 and the analog-to-digital converter 1000a of FIG. 3. The analog-to-digital converter 2171 may determine the logic level of the comparison signal CS by comparing the analog signal and the selected reference signal VC in the first comparison mode, and determine the logic level of the comparison signal CS by comparing the difference voltage VD with the ramp signal VF in the second comparison mode.

The analog-to-digital converter according to some example embodiments may be employed in an image sensor for performing a digital double sampling (DDS) as the CDS, as described with reference to FIGS. 14 and 15. For DDS, the reset signal and the measured image signal may be both converted to respective digital signals. The final image signal may be determined from a difference of such respective digital signals.

Figure 14:
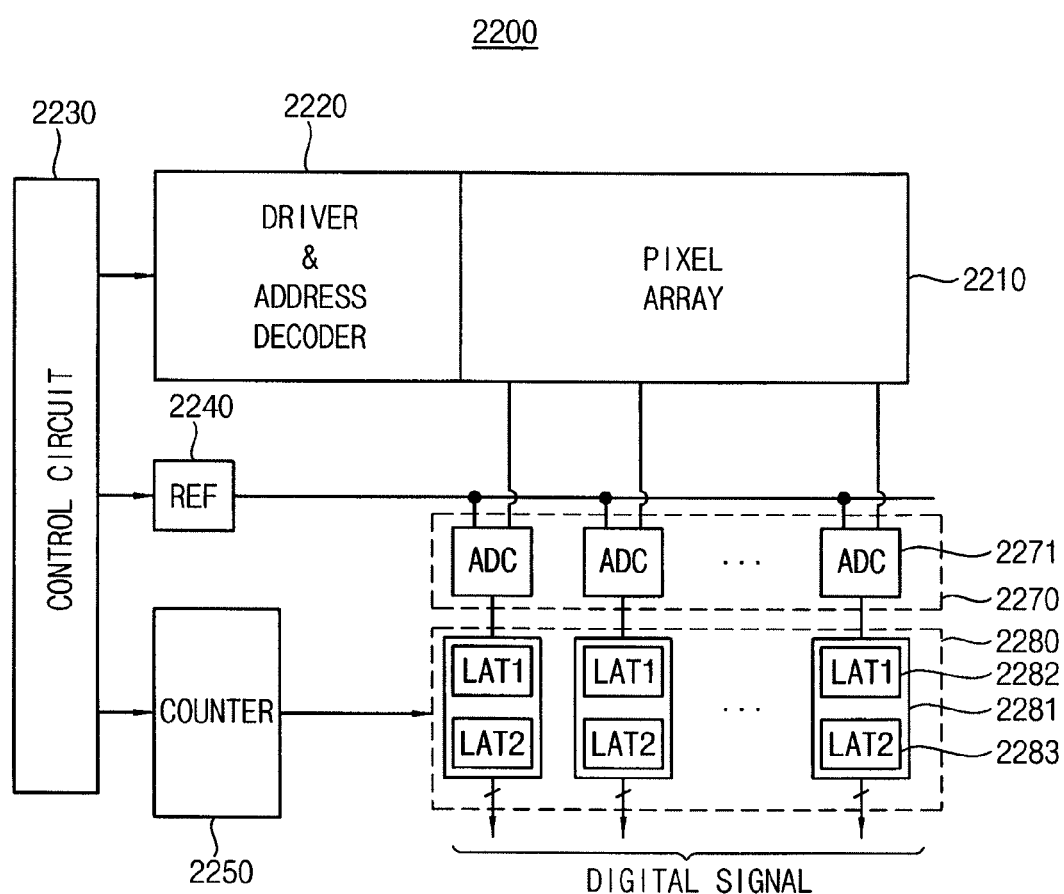

Referring to FIG. 14, the image sensor 2200 includes a pixel array 2210, a driver/address decoder 2220, a control circuit 2230, a reference signal generator 2240, a counter circuit 2250, the analog-to-digital conversion circuit 2270, and a latch circuit 2280.

In the image sensor 2200 of FIG. 14, each respective latch 2281 for a column may include a respective first latch 2282 and a respective second latch 2283. The pixel array 2210 may generate a respective reset signal and a respective measured image signal for each column. In a first sampling, each analog-to-digital converter 2271 may compare the respective reset signal with a ramp reference signal from the reference signal generator 2240 to generate a respective comparison signal having a transition time point corresponding to the level of the reset signal. The bit signals from the counter circuit 2250 are commonly provided to all of the latches 2282 and 2283. The respective first latch 2282 may latch the bit signals from the counter circuit 2250 at the transition time point of the respective comparison signal.

In a second sampling, each analog-to-digital converter 2271 may compare the respective measured image signal with the ramp reference signal to generate a respective comparison signal having a transition time point corresponding to level of the measured image signal. The respective second latch 2283 may latch the bit signals from the MDR counter circuit 2250 at the transition time point of the respective comparison signal during the second sampling. Such first and second count values latched by the first and second latches 2282 and 2283 during the first and second samplings may be provided to internal logic circuits that determine a difference of such count values to determine the final image signal in digital form for DDS in the image sensor 2200.

The analog-to-digital converter 2271 may operate in the single-slope scheme with the two-step comparison. The analog-to-digital converter 2271 may be, e.g., the analog-to-digital converter 1000 of FIG. 1, the analog-to-digital converter 1000a of FIG. 3, etc.

The image sensors 2100 and 2200 of FIGS. 13 and 14 may each include a common counter circuit for performing CDS. Alternatively, an image sensor may include a plurality of counters (referred to as column counters) coupled to the multiple columns. Hereinafter, the image sensor using the column counters is now described.

Figure 15:
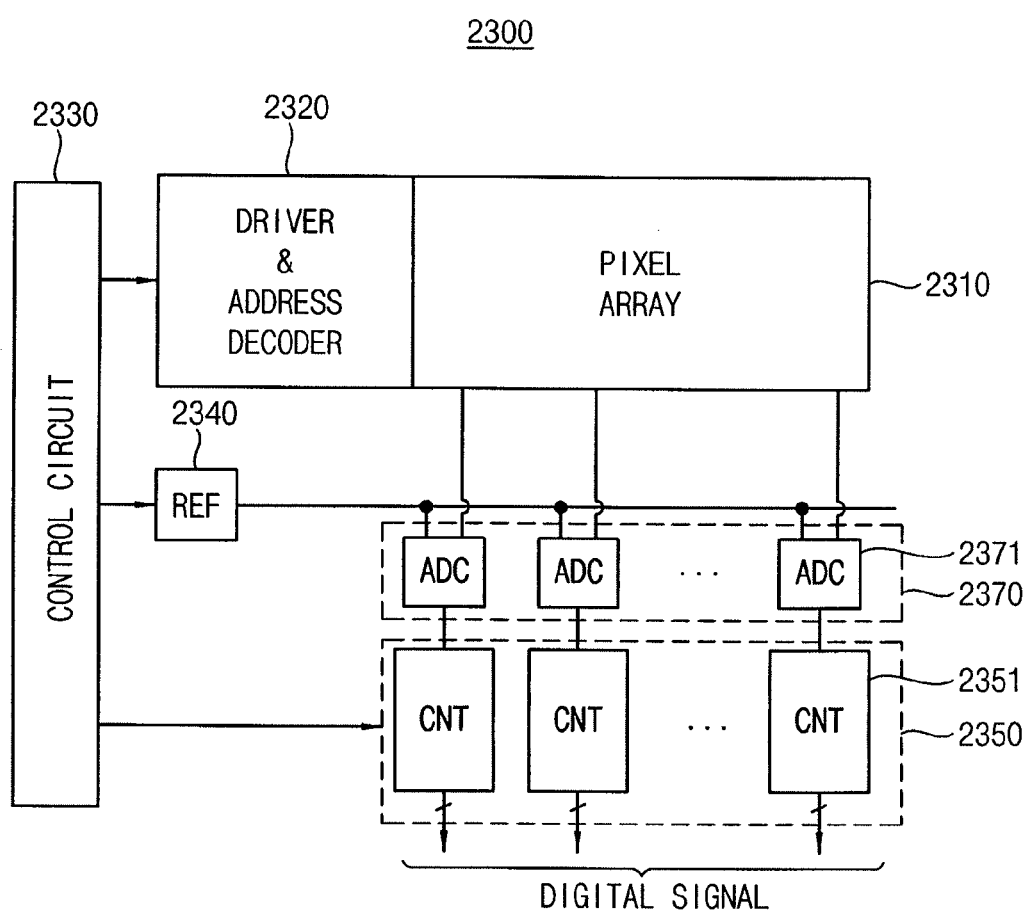

Referring to FIG. 15, the image sensor 2300 includes a pixel array 2310, a driver/address decoder 2320, a control circuit 2330, a reference signal generator 2340, a counter circuit 2350, and the analog-to-digital conversion circuit 2370.

The pixel array 2310 may include a plurality of pixels for converting incident light into electrical analog signals. The driver/address decoder 2320 may control operation of the pixel array 2310 by each column and/or row. The control circuit 2330 may generate control signals for controlling operation of the components of the image sensor 2300.

The analog signals generated by the pixel array 2310 may be converted into digital signals by the analog-to-digital conversion circuit 2370 and the counter circuit 2350. The analog signals may be output column by column. Thus, the analog-to-digital conversion circuit 2370 and the counter circuit 2350 may include a respective analog-to-digital converter 2371 and a respective counter unit 2351 for each column. Accordingly, the image sensor 2300 may simultaneously processes the analog signals for the columns of one row for enhanced operation speed and reduced noise.

The pixel array 2310 may sequentially output a respective reset signal and a respective measured image signal from a pixel for CDS. The analog-to-digital conversion circuit 2370 and the counter circuit 2350 may perform CDS digitally on such reset and measured image signals for performing DDS for the columns of the pixel array 2310. The analog-to-digital converter 2371 may operate in the single-slope scheme with the two-step. The analog-to-digital converter 2371 may be one of the analog-to-digital converter 1000 of FIG. 1 and the analog-to-digital converter 1000*a* of FIG. 3.

Figure 16:
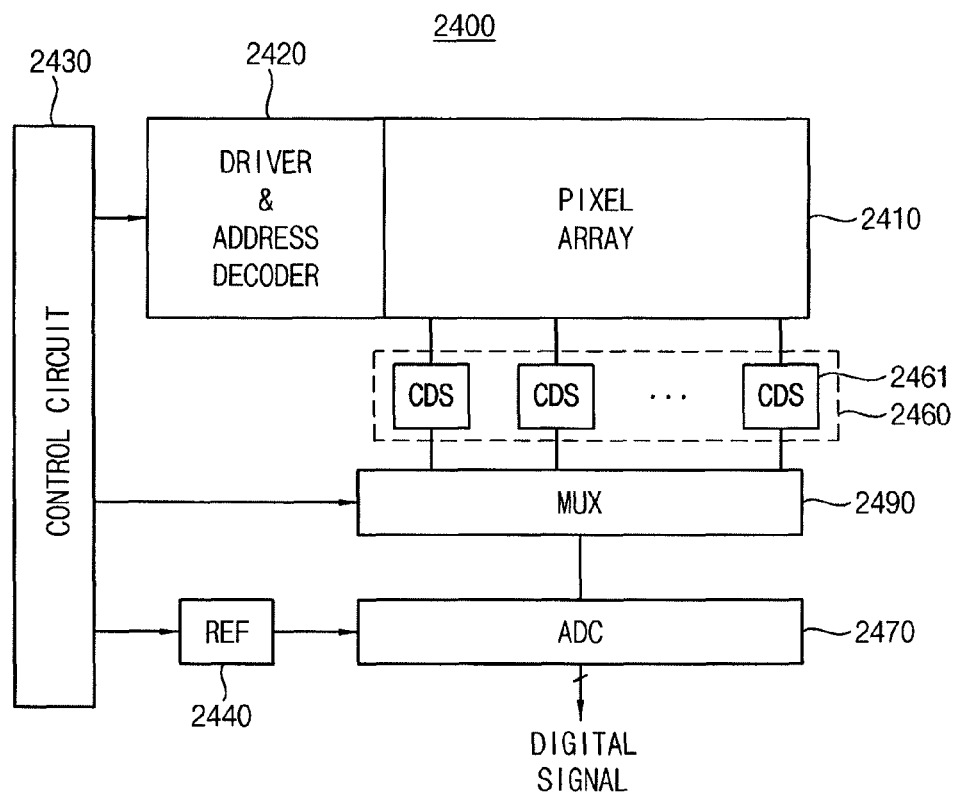

Referring to FIG. 16, the image sensor 2400 includes a pixel array 2410, a driver/address decoder 2420, a control circuit 2430, a reference signal generator 2440, a CDS circuit 2460, the analog-to-digital converter 2470, and a multiplexer 2490.

While examples of the image sensor 2100, 2200 and 2300 performing analog-to-digital conversion operations column by column are illustrated in FIGS. 13, 14 and 15, the image sensor 2400 of FIG. 16 may utilize the single analog-to-digital converter 2470 for converting an analog signal of each column into a digital signal one after another.

The pixel array 2410 may include a plurality of pixels for converting incident light into electrical analog signals. The driver/address decoder 2420 controls operation of the pixel array 2410 by each column and/or row. The control circuit 2430 may generate control signals for controlling operation of the components of the image sensor 2400.

The CDS circuit 2460 may perform ADS by obtaining a difference between an analog reset signal corresponding to a reset component and an analog data signal corresponding to a measured signal component, and output an analog signal corresponding to an effective signal component column by column. The multiplexer 2490 may output analog signals transmitted through column lines one after another. The analog-to-digital converter 2470 may convert each analog signal into a digital signal. The analog-to-digital converter 2470 may operate in the single-slope scheme with the two-step comparison. The analog-to-digital converter 2470 may be the analog-to-digital converter 1000*b* of FIG. 10.

The image sensor 2400 may include the single analog-to-digital converter 2470 for converting signals through a plurality of column lines, thereby reducing a circuit size.

As described above, one or more embodiments of an analog-to-digital converter may reduce power consumption and signal conversion time. Thus, the image sensor including the analog-to-digital converter may have a relatively high frame rate and high resolution, and may generate a high-quality image although a frame rate, a resolution, and the number of unit pixels in the image sensor are increased.

Figure 17:
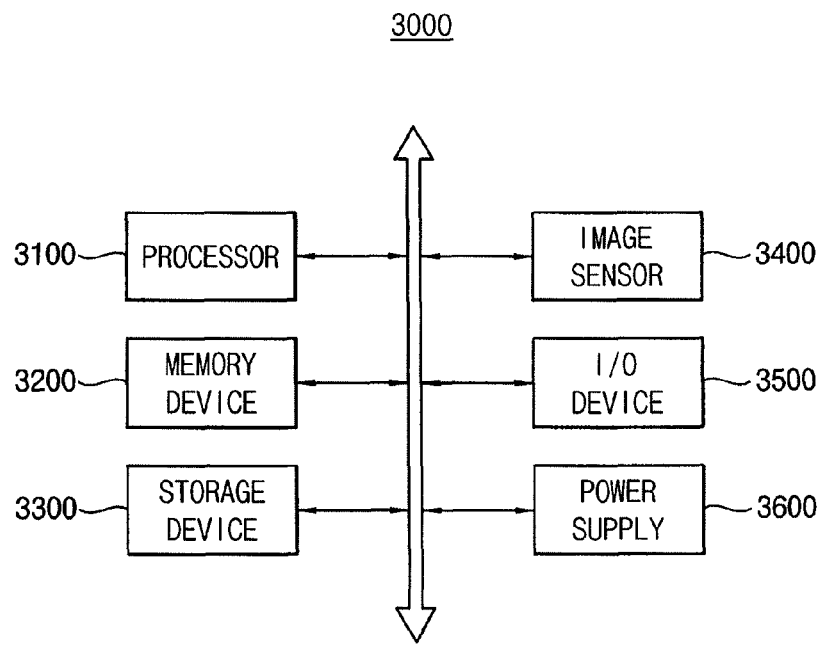
FIG. 17 illustrates a block diagram of an exemplary embodiment of an electronic system including one of the image sensors of FIGS. 13, 14, 15 and 16.

FIG. 17 illustrates a block diagram of an exemplary embodiment of an electronic system including one of the image sensors 2100, 2200, 2300, 2400 of FIGS. 13, 14, 15 and 16.

Referring to FIG. 17, the electronic system 3000 may include a processor 3100, a memory device 3200, a storage device 3300, an input/output (I/O) device 3500, a power supply 3600 and an image sensor 3400. Although not illustrated in FIG. 17, the electronic system 3000 may further include a plurality of ports for communicating a video card, a sound card, a memory card, a universal serial bus (USB) device, other electric devices, etc.

The processor 3100 may perform various computing functions. The processor 3100 may be a micro processor, a central processing unit (CPU), and etc. The processor 3100 may be connected to the memory device 3200, the storage device 3300, and the I/O device 3500 via a bus such as an address bus, a control bus, a data bus, etc. The processor 3100 may be connected to an extended bus such as a peripheral component interconnection (PCI) bus.

The memory device 3200 may store data for operations of the electronic system 3000. For example, the memory device 3200 may include a dynamic random access memory (DRAM) device, a static random access memory (SRAM) device, an erasable programmable read-only memory (EPROM) device, an electrically erasable programming read-only memory (EEPROM) device, a flash memory device, etc.

The storage device 3300 may include a solid state drive device, a hard disk drive device, a CD-ROM device, etc. The I/O device 3500 may include input devices such as a keyboard, a keypad, a mouse, etc., and output devices such as a printer, a display device, etc. The power supply 3600 may provide a power for operations of the electronic system 3000.

The image sensor 3400 may communicate with the processor 3100 via the bus or other communication links. The image sensor 3400 may be, e.g., the image sensor 2100 of FIG. 13, the image sensor 2200 of FIG. 14, the image sensor 2300 of FIG. 15, the image sensor 2400 of FIG. 16, etc. The image sensor 3400 may include the analog-to-digital converter according to some example embodiments that operates in the single-slope scheme with the two-step. One or more embodiments of the analog-to-digital converter according may use one ramp signal VF, may include the comparison signal generation unit 1100 without sampling capacitors, and/or may perform the fine comparison operation based on the difference voltage VD, thereby reducing power consumption and signal conversion time.

In one or more embodiments, the image sensor 3400 and the processor 3100 may be fabricated as one integrated circuit chip. In one or more other embodiments, the image sensor 3400 and the processor 3100 may be fabricated as two separate integrated circuit chips.

The above described embodiments may be applied to an image sensor, and an electronic system having the image sensor. For example, the electronic system may be a system using an image sensor such as a computer, a digital camera, a 3-D camera, a cellular phone, a personal digital assistant (PDA), a scanner, a navigation system, a video phone, a surveillance system, an auto-focusing system, a tracking system, a motion-sensing system, an image-stabilization system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An analog-to-digital converter, comprising:
a comparison signal generation unit configured to determine a logic level of a comparison signal by comparing an input signal with a selected reference signal based on a switch control signal in a first comparison mode, and configured to determine the logic level of the comparison signal by comparing a difference voltage with a ramp signal based on the switch control signal in a second comparison mode, the difference voltage being generated based on the input signal and the selected reference signal such that a level of the difference voltage is lower than a fine voltage level corresponding to a voltage level of the selected reference signal in the second comparison mode; and
a control unit configured to generate the switch control signal based on the comparison signal and a mode selection signal.

2. The analog-to-digital converter as claimed in claim 1, wherein the comparison signal generation unit is configured to perform a first comparison operation on the input signal and the selected reference signal in the first comparison mode, and to store a residue voltage generated by performing the first comparison operation in the first comparison mode.

3. The analog-to-digital converter as claimed in claim 2, wherein the residue voltage corresponds to a difference between a voltage level of the input signal and a voltage level of the selected reference signal at a point in time at which the comparison signal is transitioned from a first logic level to a second logic level in the first comparison mode.

4. The analog-to-digital converter as claimed in claim 2, wherein the comparison signal generation unit is configured to generate the difference voltage by subtracting the residue voltage from the selected reference signal in the second comparison mode, and to perform a second comparison operation on the difference voltage and the ramp signal in the second comparison mode.

5. The analog-to-digital converter as claimed in claim 4, wherein a voltage level of the selected reference signal is sequentially increased or decreased from an initial voltage level by a predetermined voltage level during the first comparison mode, and is the fine voltage level during the second comparison mode, the level of the difference voltage is between the initial voltage level and the fine voltage level.

6. The analog-to-digital converter as claimed in claim 1, wherein the comparison signal generation unit includes:
an input unit configured to selectively output one of the input signal and the difference voltage as a first signal based on the switch control signal, and configured to selectively output one of the selected reference signal and the ramp signal as a second signal based on the switch control signal; and
a comparison unit configured to compare the first signal with the second signal to generate the comparison signal.

7. The analog-to-digital converter as claimed in claim 6, wherein the switch control signal includes a first switch control signal and a second switch control signal, and wherein the input unit includes:
a first input block configured to provide the input signal to the comparison unit based on the first switch control signal in the first comparison mode; and
a second input block configured to store a residue voltage corresponding to the input signal and provide the selected reference signal to the comparison unit based on the second switch control signal in the first comparison mode, and configured to generate the difference voltage by subtracting the residue voltage from the selected reference signal and provide the difference voltage and the ramp signal to the comparison unit based on the second switch control signal in the second comparison mode.

8. The analog-to-digital converter as claimed in claim 6, wherein the switch control signal includes a first switch control signal and a second switch control signal, and wherein the input unit includes:
a first switch configured to selectively connect an input terminal of the input signal to a first input terminal of the comparison unit in response to the first switch control signal;
a capacitor connected between the first input terminal of the comparison unit and an input terminal of the selected reference signal;
a second switch configured to selectively connect the input terminal of the selected reference signal to a second input terminal of the comparison unit in response to an inversion signal of the second switch control signal; and
a third switch configured to selectively connect the second input terminal of the comparison unit to an input terminal of the ramp signal in response to the second switch control signal.

9. The analog-to-digital converter as claimed in claim 8, wherein the first switch and the second switch are turned on during the first comparison mode and are turned off during the second comparison mode, the third switch is turned off during the first comparison mode and is turned on during the second comparison mode.

10. The analog-to-digital converter as claimed in claim 1, further comprising:
a reference signal selection unit configured to output the selected reference signal by selecting one of reference voltages based on a selection control signal,
wherein the control unit further generates the selection control signal based on the comparison signal and the mode selection signal.

11. The analog-to-digital converter as claimed in claim 10, wherein the reference voltages include first through n-th reference voltages, where n is a natural number equal to or greater than two, and the first through n-th reference voltages are increased or decreased by a predetermined voltage level as n increases.

12. The analog-to-digital converter as claimed in claim 10, wherein the reference signal selection unit sequentially increases or decreases the voltage level of the selected reference signal from an initial voltage level to a final voltage level based on the selection control signal during a first period of the first comparison mode, and maintains the voltage level of the selected reference signal as the final voltage level based on the selection control signal during a second period of the first comparison mode, the first comparison mode being divided into the first period and the second period depending on the logic level of the comparison signal.

13. The analog-to-digital converter as claimed in claim 10, wherein the selection control signal includes a plurality of control signals, and the reference signal selection unit includes a plurality of switches such that each switch selectively provides one of the reference voltages to an output terminal of the reference signal selection unit based on a respective one of the plurality of control signals.

14. The analog-to-digital converter as claimed in claim 1, further comprising:
a digital signal generation unit configured to generate a digital signal corresponding to the input signal by counting a clock signal based on the comparison signal.

15. An image sensor, comprising:
a pixel array including a plurality of unit pixels, each unit pixel configured to convert an incident light into a pixel signal; and
an analog-to-digital converter configured to generate a digital signal based on the pixel signal, a selected reference signal and a ramp signal, the analog-to-digital converter including:
a comparison signal generation unit configured to determine a logic level of a comparison signal by comparing the pixel signal with the selected reference signal based on a switch control signal in a first comparison mode, and configured to determine the logic level of the comparison signal by comparing a difference voltage with the ramp signal based on the switch control signal in a second comparison mode, the difference voltage being generated based on the pixel signal and the selected reference signal such that a level of the difference voltage is lower than a fine voltage level corresponding to a voltage level of the selected reference signal in the second comparison mode, the comparison signal corresponding to the digital signal; and
a control unit configured to generate the switch control signal based on the comparison signal and a mode selection signal.

* * * * *